US009051659B2

(12) United States Patent
DeLuca et al.

(10) Patent No.: US 9,051,659 B2
(45) Date of Patent: Jun. 9, 2015

(54) SILICON SINGLE CRYSTAL DOPED WITH GALLIUM, INDIUM, OR ALUMINUM

(75) Inventors: John P. DeLuca, Chesterfield, MO (US); Frank S. Delk, II, Henrica, VA (US); Bayard K. Johnson, Jefferson Hills, PA (US); William L. Luter, St. Charles, MO (US); Neil D. Middendorf, St. Louis, MO (US); Dick S. Williams, St. Charles, MO (US); Nels Patrick Ostrom, Worden, IL (US); James N. Highfill, St. Paul, MO (US)

(73) Assignee: GTAT IP HOLDING, Merrimack, NH (US)

( * ) Notice: Subject to any disclaimer, the term of this patent is extended or adjusted under 35 U.S.C. 154(b) by 816 days.

(21) Appl. No.: 13/224,019

(22) Filed: Sep. 1, 2011

(65) Prior Publication Data

US 2012/0056135 A1    Mar. 8, 2012

Related U.S. Application Data

(60) Provisional application No. 61/402,776, filed on Sep. 3, 2010.

(51) Int. Cl.
*C30B 15/04* (2006.01)
*C30B 29/06* (2006.01)
*C30B 15/00* (2006.01)

(52) U.S. Cl.
CPC .................. *C30B 15/04* (2013.01); *C30B 29/06* (2013.01); *C30B 15/002* (2013.01)

(58) Field of Classification Search
CPC ...... C30B 15/04; C30B 15/002; C30B 15/00; C30B 15/14; C30B 15/02; C30B 15/10; C30B 15/12
USPC .......................... 117/13, 15, 16, 21, 202, 213
See application file for complete search history.

(56) References Cited

U.S. PATENT DOCUMENTS

| | | |
|---|---|---|
| 3,582,287 A | 6/1971 | Capita |
| 4,134,785 A | 1/1979 | Lavigna et al. |
| 4,152,536 A | 5/1979 | Ravi |
| 4,246,064 A | 1/1981 | Dewees et al. |
| 4,282,184 A | 8/1981 | Fiegl et al. |
| 4,330,362 A | 5/1982 | Zulehner |
| 4,659,421 A | 4/1987 | Jewett |
| 4,851,297 A | 7/1989 | Allen et al. |
| 4,968,380 A | 11/1990 | Freedman et al. |
| 4,980,015 A | 12/1990 | Ono et al. |
| 5,021,225 A | 6/1991 | Yamashita et al. |
| 5,034,200 A | 7/1991 | Yamashita et al. |
| 5,037,503 A | 8/1991 | Kajimoto et al. |
| 5,078,830 A | 1/1992 | Shirata et al. |
| 5,152,867 A | 10/1992 | Kitaura et al. |
| 5,242,531 A | 9/1993 | Klingshirn et al. |
| 5,260,037 A | 11/1993 | Kitaura et al. |
| 5,284,631 A | 2/1994 | Kaneto et al. |
| 5,288,366 A | 2/1994 | Holder |
| 5,290,395 A | 3/1994 | Matsumoto et al. |
| 5,314,667 A | 5/1994 | Lim et al. |
| 5,324,488 A | 6/1994 | Klingshirn et al. |
| 5,373,807 A | 12/1994 | Holder |
| 5,462,011 A | 10/1995 | Tomzig et al. |
| 5,506,154 A | 4/1996 | Kawahara et al. |
| RE35,242 E | 5/1996 | Kajimoto et al. |
| 5,587,016 A | 12/1996 | Altekrüger et al. |
| 5,700,320 A | 12/1997 | Izunome et al. |
| 5,700,321 A | 12/1997 | Niikura |
| 5,704,974 A | 1/1998 | Izunome et al. |
| 5,840,115 A | 11/1998 | Taguchi et al. |
| 5,866,094 A | 2/1999 | Niikura |
| 5,891,245 A | 4/1999 | Atami et al. |
| 5,900,055 A | 5/1999 | Nagai et al. |
| 5,902,395 A | 5/1999 | Nagai et al. |

(Continued)

FOREIGN PATENT DOCUMENTS

| | | |
|---|---|---|
| CN | 101399297 A | 4/2009 |
| CN | 101805925 A | 8/2010 |
| EP | 0350305 A2 | 1/1990 |
| EP | 0 737 597 A2 | 10/1996 |
| EP | 0 798 403 A1 | 10/1997 |
| EP | 1 114 885 B1 | 3/2006 |
| EP | 1811065 A1 | 7/2007 |
| JP | 8-259382 A | 10/1996 |
| JP | 8-330611 A | 12/1996 |

(Continued)

OTHER PUBLICATIONS

International Search Report and Written Opinion dated Mar. 2, 2012 for PCT/US2011/050226.

(Continued)

*Primary Examiner* — Mark Kopec
*Assistant Examiner* — Haidung Nguyen
(74) *Attorney, Agent, or Firm* — Parker Ibrahim & Berg LLC; James M. Behmke; Stephen D. LeBarron

(57) ABSTRACT

A doped silicon single crystal having a resistivity variation along a longitudinal and/or radial axis of less than 10% and a method of preparing one or a sequential series of doped silicon crystals is disclosed. The method includes providing a melt material comprising silicon into a continuous Czochralski crystal growth apparatus, delivering a dopant, such as gallium, indium, or aluminum, to the melt material, providing a seed crystal into the melt material when the melt material is in molten form, and growing a doped silicon single crystal by withdrawing the seed crystal from the melt material. Additional melt material is provided to the apparatus during the growing step. A doping model for calculating the amount of dopant to be delivered into the melt material during one or more doping events, methods for delivering the dopant, and vessels and containers used to deliver the dopant are also disclosed.

23 Claims, 19 Drawing Sheets

(56) References Cited

U.S. PATENT DOCUMENTS

| | | | |
|---|---|---|---|
| 5,972,784 | A | 10/1999 | Rohatgi et al. |
| 6,171,391 | B1 | 1/2001 | Fuerhoff et al. |
| 6,310,454 | B1 | 10/2001 | Moran et al. |
| 6,313,398 | B1 | 11/2001 | Yamada et al. |
| 6,658,375 | B1 | 12/2003 | McQuarrie et al. |
| 6,776,840 | B1 | 8/2004 | Fuerhoff et al. |
| 6,815,605 | B1 | 11/2004 | Abe et al. |
| 6,830,740 | B2 | 12/2004 | Oki et al. |
| 6,984,263 | B2 | 1/2006 | Wang et al. |
| 7,635,414 | B2 | 12/2009 | Bender |
| 2003/0061985 | A1 | 4/2003 | Kulkarni et al. |
| 2005/0092236 | A1 | 5/2005 | Bender |
| 2005/0252544 | A1 | 11/2005 | Rohatgi et al. |
| 2007/0007269 | A1 | 1/2007 | Kim |
| 2007/0052931 | A1 | 3/2007 | Kanatani et al. |
| 2007/0056504 | A1 | 3/2007 | Lim |
| 2007/0090130 | A1 | 4/2007 | Hidaka et al. |
| 2007/0169683 | A1* | 7/2007 | Haga et al. ............ 117/13 |
| 2007/0193501 | A1 | 8/2007 | Ono et al. |
| 2008/0134958 | A1 | 6/2008 | Bender |
| 2008/0241986 | A1 | 10/2008 | Rohatgi et al. |
| 2008/0241987 | A1 | 10/2008 | Rohatgi et al. |
| 2008/0241988 | A1 | 10/2008 | Rohatgi et al. |
| 2009/0007965 | A1 | 1/2009 | Rohatgi et al. |
| 2009/0039478 | A1 | 2/2009 | Bucher et al. |
| 2009/0155605 | A1 | 6/2009 | Lee et al. |
| 2010/0050931 | A1 | 3/2010 | Narushima et al. |

FOREIGN PATENT DOCUMENTS

| | | |
|---|---|---|
| JP | 09-309790 | 12/1997 |
| JP | 2002-160995 | 6/2002 |
| JP | 2010184839 A | 8/2010 |
| KR | 1 00 777 337 B1 | 11/2007 |
| WO | WO 00/73542 A1 | 12/2000 |
| WO | WO-2010/021272 A1 | 2/2010 |

OTHER PUBLICATIONS

Wang, et al., 24% efficient silicon solar cells, Appl. Phys. Lett., vol. 57, No. 6, 602-604 (1991).

Saitoh, et al., *Light Degradation and Control of Low-Resistivity CZ-Si Solar Cells— An International Joint Research*, Int'l PVSEC-11, 553-556 (1999).

Rohatgi, et al., *Research on the basic understanding of high efficiency in silicon solar cells*, The Smithsonian/NASA Astrophysics Data System, http://adsabs.harvard.edu/abs/1984mri..rept (1982-1983).

Fodor, et al., *Advanced silicon materials for space solar cells*, http://dialogweb.com/cgi/dwcleint (1980).

Ciszek, *Material considerations for high efficiency silicon solar cells*, Solar Cells, 21 81-98 (1987).

Bernard, et al., *The reduction of radiation damages in solar cells. A study of radiation defects in silicon*, The Smithsonian/NASA Astrophysics Data System, http://adsabs.harvard.edu/aba/1983STIN... 8624024B (1983).

Banerjee, et al., *Radiation hardness and conduction mechanisms of MINP solar cells on Ga- and B-doped Si substrates*, New York, Institute of Electrical and Electronics Engineers, Inc., 644-649 (1987).

De Angelis, et al., *Defects in electron-irradiated, gallium-doped silicon*, Appl. Phys. Lett. 42 (7), 613-615 (1983).

Fischer, et al., *Additional observations on the gallium-x center in neutron-irradiated Si: Ga*, Appl. Phys. Lett., vol. 58, No. 8, 15, 3118-3123 (1985).

Linares, *The Mobility, Resistivity and Carrier Density in p-Type Silicon Doped with Boron, Gallium and Indium*, U.S. Department of Commerce National Technical Information Service, ADA091310 1-148, (1979).

English Translation of Japanese Unexamined Patent Application Publication No. H5-208892, *Method for Manugacturing Silicon Monocrystal Rod*, (1993).

English Translation of Japanese Unexamined Patent Application Publication No. H7-206853, *Method for Growing Impurity-Added Silicon Monocrystal*, (1995).

English Translation of Japanese Unexamined Patent Application Publication No. H8-259382, *Method for Growing Silicon Monocrystal by Controlling Melt Convection*, (1996).

Ehrstein, *Spreading Resistance Calibration for Gallium- or Aluminum-Doped Silicon*, J. Electrochem, Soc.: Solid-State Science and Technology Vo. 127, No. 6, 1403-1404 (1980).

Glunz, et al., *Comparison of Boron- and Gallium-doped p-Type Czochralski Silicon for Photovoltaic Application*, Prog. Photovolt: Res. Appl. 7, 463-469 (1999).

Minahan, et al., *Irradiated Solar Cells Fabricated From Gallium-Doped/Boron-Doped FZ and CZ Silicon*, Institute of Electrical and Electronics Engineers, 310-315 (1982).

Wolf, et al., *Silicon Processing for the VLSI Era*, Lattice Press, ISBN 0-961672-3-7, 1-35 (1986).

Brandhorst, *The NASA Lewis Research Center Program in Space Solar Cell Research and NASA Astrophysics Data System*, 1979NASCP2097, 1-8 (1979).

Glunz, et al., *100 $cm^2$ Solar Cells on Czochralski Silicon with an Efficiency of 20. 2%* Prog. Photovolt. Res. Appl. 237-240 (2000).

Ciszek, et al., *Silicon Float-Zone Crystal Growth as a Tool for the Study of Defects and Impurities*, National Renewable Energy Laboratory NREL/CP-520-28569 1-13 (2000).

Mason, et al., *The Selection and Performance of Monocrystalline Silicon Substrates for Commercially Viable 20% Efficient Lid-Free Solar Cells*, 19th European PV Solar Conference, Paris (2004).

Scott-Monch, et al. *Effect of Dopants on Annealing Performance of Silicon Sol Cells*, NASA Astrophysics Data System 1979NACP2097, 173-179 (1997).

Uda, et al., *Enfancement of Ga doping in Czochralski-grown Si crystal by B- codoping*, JSPS Si Symposium, 1-11 (2008).

Lauermann, et al., *Large Area Solar Cells Made From Degradation-Free, Low Restitivity Gallium Doped CZ Wafers*, 25th European Photovoltaic Solar Energy Conference and Exhibition / 5th World Conference on Photovoltaic Energy Conversion (2010).

Gledhill, et al. *High Efficiency Monocrystalline Silicon Solar Cells on B-Doped FZ and Ga-Doped CZ Wafers*, BP Solar, European Technology Centre. This information was publicly available prior to Sep. 3, 2010, the filed of the provisional application on which this application depends.

Green et al., *Improvements in Silicon Solar Cell Efficiency*, Solar Cells, 17 75-83 (1986).

Schmidt et al., *Investigation of carrier lifetime instabilities in Cz-grown silicon*, Conference Record of the Twenty Sixth IEEE Photovoltaic Specialists Conference, 1-6, (1997).

Deb, *Recent Developments in High-Efficiency PV Cells*, National Renewable Energy Laboratory NREL/CP-590-28060, 1-16 (2000).

Glunz, et al., *Degradation of carrier lifetime in Cz silicon solar cells*, Solar Energy Materials & Solar Cells 65, 219-229, (2001).

Glunz, et al., *Minority carrier lifetime degradation in boron-doped Cz silicon*, Journal of Applied Physics, vol. 90, No. 5, 2397-2404, (2001).

Fodor, et al., *Advanced Silicon Materials for Space Solar Cells*, Conference Record of the Fourteenth IEEE Photovoltaic Specialists Conference, 882-886 (1980).

Rohatgi, et al., *Research on the Basic Understanding of High Efficiency in Silicon Solar Cells*, SERI/STR-211-2451. UC Category: 63, DE85000507 1-118 (1984).

Hoshikawa, et al., *Relationship between Gallium Concentration and Resistivity of Gallium-Doped Czochralski Silicon Crystals: Investigation of a Conversion Curve*, Jpn. J. Appl. Physic 47 8691-8695 (2008).

Huanga, et al., *Ga segregation in Czochralski-Si crystal growth with B codoping*, Journal of Crystal Growth, 310 (14) 3335-3341 (2008).

Lee, et al., *Axial Distribution of Gallium in Silicon Crystals for Photovoltiac Applications*, Jpn. J. Appl. Phys 46 2831-2834 (2007).

European Search Report dated Jan. 2, 2014 issued in connection with European Application No. 11822675.2.

\* cited by examiner

Example: Batch CZ (no evaporation)

$$\frac{dC_L}{dt} = -\frac{kC_L}{M_L}\frac{dM_x}{dt} + \frac{1}{M_L}\frac{dN_F}{dt} - \frac{gA_s}{M_L}C_L - \frac{C_L}{M_L}\frac{dM_F}{dt} + \frac{C_L}{M_L}\frac{dM_x}{dt}$$

In BCZ (no evap.)

$\frac{dM_F}{dt} = 0$  No feeding $\frac{dN_F}{dt} = 0$  No feeding $\frac{dM_x}{dt} = -\frac{dM_L}{dt}$  Solidification=melt removal rate $g = 0$  No evap Sub into the above and find the simplified rate eqn:

$$\frac{1}{C_L}\frac{dC_L}{dt} = (k-1)\frac{1}{M_L}\frac{dM_L}{dt}$$

And solve with initial conditions,
$C_L(t=0) = C_0$
$M_L(t=0) = M_0$

Gives the solution for BCZ:

$$C_L = C_0\left(\frac{M_L}{M_0}\right)^{k-1} = C_0\left(1 - \frac{M_x}{M_0}\right)^{k-1}$$

Familiar result from batch

*FIG. 3*

Example: Continuous CZ (no evaporation)

$$\frac{dC_L}{dt} = -\frac{kC_L}{M_L}\frac{dM_x}{dt} + \frac{1}{M_L}\frac{dN_F}{dt} - \frac{gA_s}{M_L}C_L - \frac{C_L}{M_L}\frac{dM_F}{dt} + \frac{C_L}{M_L}\frac{dM_x}{dt}$$

In CCZ (no evap.)

$\frac{dM_F}{dt} = \frac{dM_x}{dt}$  feed rate=growth rate $\frac{dN_F}{dt} = C_F \frac{dM_x}{dt}$  define $C_F$=dopant concentration in feed.

$g = 0$  No evaporation

Also use the following identity
$\frac{dC_L}{dt} = \frac{dC_L}{dM_x}\frac{dM_x}{dt}$ Sub into the above and find the simplified rate eqn:

$$\frac{dC_L}{dM_x} = -\frac{k}{M_L}C_L + \frac{C_F}{M_L}$$

And solve with initial condition,
$C_L(t=0) = C_0$

Where:
$C_\infty = \frac{C_F}{k}$ $M^* = \frac{M_L}{k}$

Gives the solution for CCZ with no evap:

$$C_L = (C_0 - C_\infty)\exp\left(-\frac{M_x}{M^*}\right) + C_\infty$$

*FIG. 4*

Example: Continuous CZ (evaporation)

$$\frac{dC_L}{dt} = -\frac{kC_L}{M_L}\frac{dM_x}{dt} + \frac{1}{M_L}\frac{dN_F}{dt} - \frac{gA_s}{M_L}C_L - \frac{C_L}{M_L}\frac{dM_F}{dt} + \frac{C_L}{M_L}\frac{dM_x}{dt}$$

In CCZ (evap.)

$\frac{dM_F}{dt} = \frac{dM_x}{dt} \equiv \Psi$   define solidification rate $\frac{dN_F}{dt} = C_F \frac{dM_x}{dt}$   define $C_F$=dopant concentration in feed.

Also use the following identity $\frac{dC_L}{dt} = \frac{dC_L}{dM_x}\frac{dM_x}{dt}$ Sub into the above and find the simplified rate eqn:

$$\frac{dC_L}{dM_x} = -\frac{k}{M_L}C_L + \frac{C_F}{M_L} - \frac{gA_s}{M_L\Psi}C_L$$

And solve with initial condition, $C_L(t=0) = C_0$

Gives the solution for CCZ with evap.

$$C_L = (C_0 - C_\infty)\exp\left(-\frac{M_x}{M^*}\right) + C_\infty$$

Where:

$C_\infty = \dfrac{C_F}{k + \dfrac{gA_s}{\Psi}}$ $M^* = \dfrac{M_L}{k + \dfrac{gA_s}{\Psi}}$

*FIG. 5*

| Dopant Element | Segregation Coefficient | Solid Solubility in Silicon | Volatile Suboxide | Melting Point |
|---|---|---|---|---|
| Boron (B) | approx. 0.8 | $8e^{20}$ atoms/cm$^3$ | | 2300.0 °C |
| Aluminum (Al) | approx. 0.0028 | $2e^{19}$ atoms/cm$^3$ | | 660.37 °C |
| Gallium (Ga) | approx. 0.008 | $4e^{19}$ atoms/cm$^3$ | $Ga_2O$ | 29.78 °C |
| Indium (In) | approx. 0.0004 | $1e^{18}$ atoms/cm$^3$ | $In_2O$ | 156.61 °C |
| Phosporous (P) | approx. 0.35 | $1.3e^{21}$ atoms/cm$^3$ | | 44.1 °C |

*FIG. 11*

SILICON SINGLE CRYSTAL DOPED WITH GALLIUM, INDIUM, OR ALUMINUM

CROSS-REFERENCE TO RELATED APPLICATIONS

This application is based on and claims priority to U.S. Provisional Patent Application Ser. No. 61/402,776 filed on Sep. 3, 2010.

STATEMENT REGARDING FEDERALLY SPONSORED RESEARCH OR DEVELOPMENT

Not applicable.

FIELD OF THE INVENTION

This invention generally relates to single crystal ingots grown using the batch and continuous Czochralski methods and is more specifically directed to silicon single crystal ingots doped with gallium, indium and/or aluminum and methods of making and using the same.

BACKGROUND OF THE INVENTION

Several processes are known in the art for growing crystal ingots of semi-conductor materials for use in fabricating integrated circuits and photovoltaic devices such as solar cells. Batch and continuous Czochralski ("CZ") processes are widely used for semiconductor materials such as silicon, germanium, or gallium arsenide doped with an elemental additive such as phosphorus (n-type dopant) or boron (p-type dopant) to control the resistivity of the crystal. These processes are generally summarized as follows. A heated crucible holds a melted form of a charge material from which the crystal is to be grown. A seed is placed at the end of a cable or rod that will enable the seed to be lowered into the melt material and then raised back out of the melt material. When the seed is lowered into the melt material, it causes a local decrease in melt temperature, which results in a portion of the melt material crystallizing around and below the seed. Thereafter, the seed is slowly withdrawn from the melt material. As the seed is withdrawn or pulled from the melt material, the portion of the newly formed crystal that remains within the melt material essentially acts as an extension of the seed and causes melt material to crystallize around and below it. This process continues as the crystal is withdrawn or pulled from the melt material, resulting in crystal ingot growth as the seed is continually raised.

In batch CZ, the entire amount of charge material (semi-conductor and dopant) required for growing a single crystal ingot is melted at the beginning of the process. In continuous CZ ("CCZ"), the charge material is continually or periodically replenished during the growth process. In CCZ, the growth process may be stopped at intervals between crystal growth to harvest the crystal or may continue without stopping between crystal growth.

The batch CZ process is typically carried out using a pulling apparatus comprising a gas chamber, a quartz crucible positioned inside the chamber, semiconductor charge material and dopant loaded into the crucible, a heater for melting the charge material, and a pulling mechanism for pulling or drawing up a single crystal ingot of the doped semiconductor material. To carry out the CCZ process, it is necessary to modify the traditional apparatus to include a means for feeding additional charge material to the melt in a continuous or semi-continuous fashion. In an effort to reduce the adverse effects of this replenishing activity on simultaneous crystal growth, the traditional quartz crucible is modified to provide an outer or annular melt zone (into which the semi-conductor is added and melted) and an inner growth zone (from which the crystal is pulled). These zones are in fluid flow communication with one another.

In general, it is desirable for the dopant concentration in the crystal ingot to be uniform both axially (longitudinally) and radially. This is difficult to achieve due, in part, to segregation. Segregation is the tendency of the impurity or dopant to remain in the melt material instead of being drawn-up into the crystal ingot. Each dopant has a characteristic segregation coefficient that relates to the comparative ease with which the dopant atom can be accommodated into the ingot's crystal lattice. For example, because most dopant atoms do not fit into the silicon crystal lattice as well as a silicon atom, dopant atoms typically are incorporated into the crystal at less than their proportional concentration in the melt, i.e., dopants in a silicon melt generally have a segregation coefficient of less than 1. After the doped silicon is melted and crystal growth has begun, the dopant concentration increases in the melt due to rejection of the dopant at the crystal growth interface.

In general, the dopant concentration of the pulled single crystal is given as kC where the dopant concentration in the molten polycrystalline or raw material is C and where k is a segregation coefficient that is typically less than 1. During a doped batch CZ process, the amount of melt material in the crucible decreases as the crystal ingot grows, and as a result of segregation, the dopant concentration gradually increases in the remaining melt material. Due to the higher dopant concentration in the melt material, the dopant concentration in the crystal ingot also becomes higher, resulting in varying resistivity along the radial and longitudinal axis of the crystal. A doped batch CZ process potentially results in an ingot having the desired resistivity in only a small portion of the ingot.

It has been suggested that more uniform resistivity may be obtained using a CCZ process where the dopant concentration in the raw material fed successively into the annular melt zone is made equal to the dopant concentration in the pulled single crystal and the amount of single crystal pulled per unit time is made equal to the amount of charge material supplied. In so doing, it is intended that the amount of dopant supplied and pulled are balanced with each other so that the dopant concentration in the inner crucible equals C/k and the concentration in the outer crucible equals C in a steady state. A variety of different processes and configurations of crucibles have been suggested in an effort to maintain the relative concentrations of the dopant within the inner and outer zones of the crucible and to otherwise achieve uniform resistivity. One problem that continues to persist during a CCZ run is the tendency for dopant to migrate or diffuse to the outer melt zone of the crucible (due to the concentration gradient), which results in lower dopant concentration and higher resistivity at the seed end of the next crystal ingot until the steady state can be achieved again.

In the past, boron has traditionally been used as the dopant for silicon single crystals used in photovoltaic solar cell applications. It has been recognized, however, that boron forms recombination active defects with oxygen under illumination thereby lowering the minority carrier lifetime. This effect known as "light induced degradation" or "LID" causes a significant voltage and current drop of the solar cells when in operation. See, J. Schmidt, A. G. Aberle and R. Hezel, "*Investigation of carrier lifetime instabilities in Cz-grown silicon*," Proc. 26th IEEE PVSC, p. 13 (1997); S. Glunz, S. Rein, J. Lee and W. Warta, "*minority carrier lifetime degradation in* boron-doped Czochralski silicon," J. Appl. Phys., 90, pp. 2397 (2001). This problem can be circumvented by using low-oxygen material or high-resistivity material to minimize boron content; however, it is also known that higher efficiencies can be obtained using relatively low-resistivity material (around 1.0 Ω-cm or below). Low-resistivity material requires a higher dopant concentration.

It has been suggested that boron can be replaced by gallium, which shows similar electronic behavior in the silicon band structure but does not form recombination active defects under illumination. While it has been suggested that a gallium doped silicon single crystal can be produced via a batch CZ process, gallium has a much smaller segregation coefficient than boron, which means the batch CZ process results in a gallium doped crystal that exhibits a large axial resistivity variation. This lack of uniformity increases the cost of production due to the limited amount of acceptable material in each ingot and/or the cost of development of cell manufacturing processes that can accommodate material exhibiting a wide resistivity range. For this reason, the use of gallium doped crystals for solar cell applications has not been widely adopted in an industrial setting although the advantages of gallium doped silicon wafers in terms of LID reduction has been known for decades.

The use of CCZ has not been suggested for making ingots doped with gallium, aluminum, or indium, all of which have a small silicon segregation coefficient. This is likely due to the fact that elemental gallium (the most preferred of the three dopants) would be difficult to add in a sufficiently high concentration using a continuous or semi-continuous feeding apparatus because it melts near room temperature and would stick to the apparatus. This not only has the potential of damaging the apparatus, but also creates operational problems such as a lack of control of the actual amount of gallium being added to the melt. In addition, gallium forms a highly volatile suboxide ($Ga_2O$) that results in significant loss of gallium from the melt due to evaporation. This evaporation effect would be exacerbated in a CCZ system due to the longer run times and greater melt surface area associated with CCZ.

BRIEF SUMMARY OF THE INVENTION

The present invention relates to a gallium, indium, or aluminum doped silicon single crystal ingot and a method of making the same. The ingot is characterized by uniform radial resistivity and uniform resistivity in the direction of growth (axial or longitudinal resistivity). Preferably, the radial and/or axial resistivity along the length of the ingot varies by less than 10%, more preferably by less than 5%, and most preferably less than 2%.

In one embodiment of the invention, a silicon single crystal ingot having relatively uniform radial and axial resistivity is grown using a CCZ process wherein a dopant selected from the group consisting of gallium, aluminum and indium or a combination thereof, and most preferably comprising gallium, is included within an initial charge of silicon and then subsequently added to the silicon melt within the inner growth chamber of the crucible between the growth of each crystal ingot. The dopant is preferably added to the inner growth chamber between ingot growth using a "sacrificial vessel" made from the melt material. The dopant is placed in the vessel in solid or liquid form and delivered to the melt in the inner growth chamber via lowering of the seed chuck. Adding dopant to the growth zone allows the system to reach its steady state more quickly, which reduces downtime and results in crystals having more uniform resistivity at the seed end. In addition and/or alternatively, dopant may be fed to the outer chamber in a continuous or semi-continuous manner during crystal growth and/or between crystal ingot growth utilizing a silicon/dopant alloy cube or a container made from silicon that encloses and retains solid or liquid elemental dopant. Given that the containers are made of silicon, the containers can be added via the feeding apparatus, along with the silicon charge material, without the dopant melting and sticking to portions of the feed apparatus during delivery.

In a related embodiment of the invention, the amount of dopant added in the initial charge, in the inner growth chamber at inter-ingot intervals and/or continuously or semi-continuously in the outer chamber is determined in accordance with a doping model that calculates the anticipated dopant concentration of the melt within the inner growth chamber by taking into consideration not only the amount of dopant removed from the melt via crystal growth but also the amount of dopant removed via evaporation. The amount of dopant determined to be added at each interval using the doping model is precisely controlled using containers or vessels filled with the correct amount of dopant. To achieve uniform resistivity in the ingot throughout crystal growth, additional dopant may be added in a controlled fashion to the outer chamber via the sealed containers (for higher concentrations of dopant) or alternatively silicon/dopant alloy (for lower concentrations of dopant). It is also anticipated that the doping model can be used to determine the appropriate amount of dopant to be incorporated within the initial charge for a batch CZ process and/or adjustments that could be made in relation to other parameters impacting the rate or amount of evaporation.

In a preferred embodiment, a gallium doped silicon single crystal is made having a resistivity ranging from 15 to 0.1 Ωcm and more preferably 10 to 0.1 Ωcm and most preferably 3 to 0.5 Ωcm. The resistivity is relatively uniform in the axial or longitudinal direction, preferably with a variation less than 10%, more preferably less than 5% and most preferably less than 2%. In addition, the radial resistivity is relatively uniform, preferably with a variation less than 10%, more preferably less than 5% and most preferably less than 2%. For the preferred resistivity ranges, the approximate concentration of gallium in the crystal ranges from about $8.9 \times 10^{14}$ atoms/cm$^3$ to $2.77 \times 10^{17}$ atoms/cm$^3$, more preferably $1.34 \times 10^{15}$ atoms/cm$^3$ to $2.77 \times 10^{17}$ atoms/cm$^3$, and most preferably $4.56 \times 10^{15}$ atoms/cm$^3$ to $3.21 \times 10^{16}$ atoms/cm$^3$. The interstitial oxygen level is preferably less than 25 parts per million atoms, more preferably less than 18 parts per million atoms and most preferably less than 15 parts per million atoms.

The present invention also encompasses the use of a control system that utilizes the doping model to calculate and control the amount of dopant added during one or more doping events. A single ingot or a sequential series of ingots may be grown in accordance with the present invention. The silicon single crystal ingot grown in accordance with the present invention may be utilized as a substrate for the manufacture of photovoltaic devices such as solar cells.

Additional aspects of the invention, together with the advantages and novel features appurtenant thereto, will be set forth in part in the description which follows, and in part will become apparent to those skilled in the art upon examination of the following, or may be learned from the practice of the invention. The objects and advantages of the invention may be realized and attained by means of the instrumentalities and combinations particularly pointed out in the appended claims.

BRIEF DESCRIPTION OF THE DRAWINGS

FIG. 3 is a summary of the dopant model as used to calculate dopant additions in batch CZ without evaporation in accordance with the present invention.

FIG. 4 is a summary of the dopant model as used to calculate dopant additions in CCZ without evaporation in accordance with the present invention.

FIG. 5 is a summary of the dopant model as used to calculate dopant additions in CCZ with evaporation in accordance with the present invention.

FIG. 11 is a summary chart of dopant properties relevant to the present invention.

DETAILED DESCRIPTION OF EXEMPLARY EMBODIMENTS

CCZ Silicon Crystal Apparatus

Figure 1:
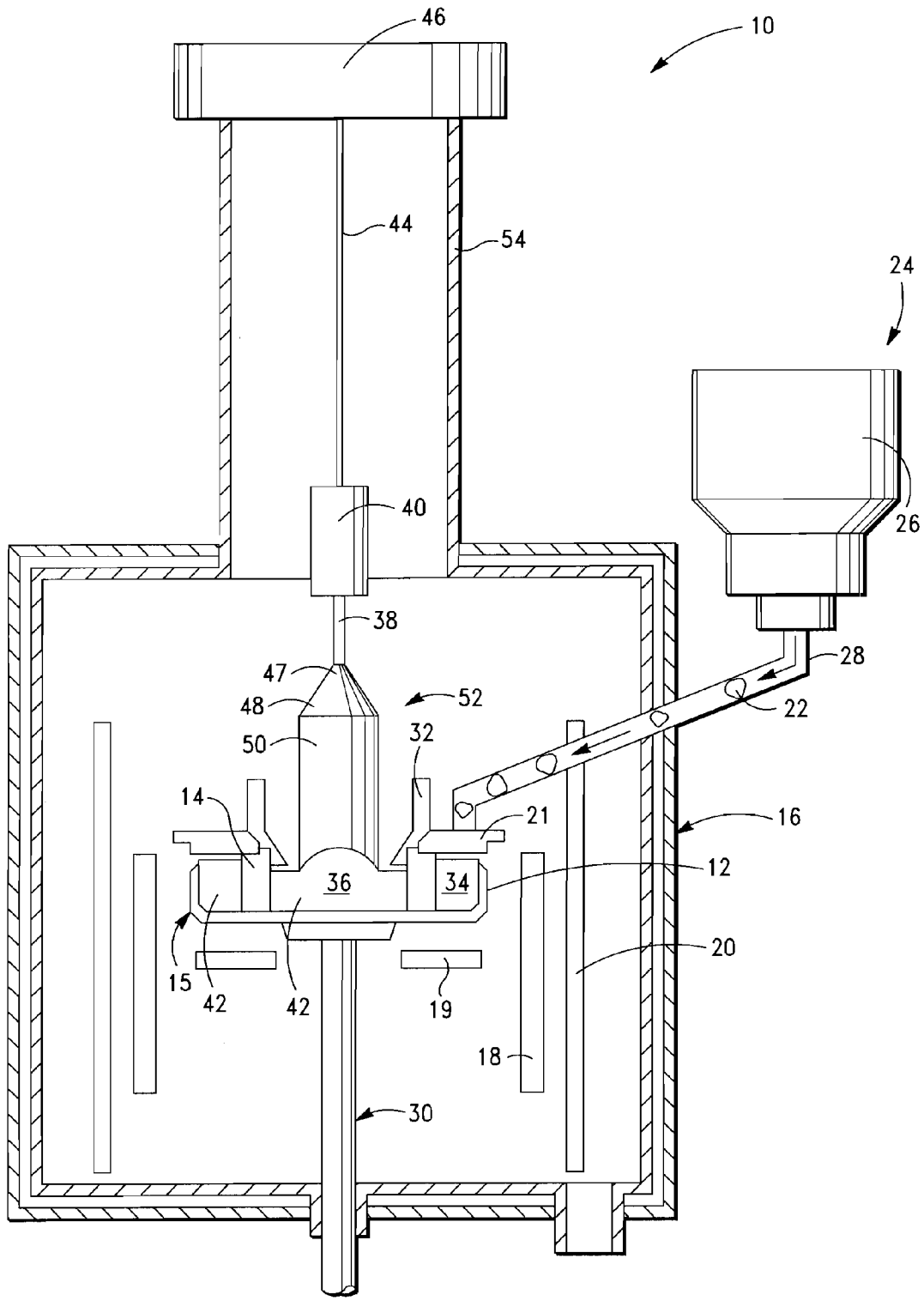
FIG. 1 is a cross-sectional view of an exemplar apparatus for pulling single crystals by CCZ method used in the present invention.

With reference to FIG. 1, the present invention may be practiced and made using a CCZ crystal ingot growing apparatus, which is shown in cross-section and generally designated by the numeral 10. The process begins with loading an outer or annular chamber 12 and inner chamber 14 of a crucible 15 with a predetermined amount of charge material 22. Crucible 15 is preferably made of quartz and coated with a devitrification promoter. The amount of dopant or dopant/silicon alloy added to inner chamber 14 and outer chamber 12 ultimately depends on the desired resistivity of the resulting ingot. Ingot resistivity and dopant concentration are substantially inversely related according to a function well known in the art. However, several factors affect the dopant concentration in the melt at the time the system reaches a steady state during crystal ingot pulling. The amount of dopant necessary to achieve the desired steady state dopant concentration, and thus produce an ingot having the desired resistivity, is determined in accordance with the doping model described below.

Crucible 15 is preferably configured to have a low aspect ratio (i.e., shallow) configuration so as require a relatively small charge mass within the crucible at any given time. The minimum melt mass within the crucible is preferably greater than 10 kg. Crucible 15 preferably has a relatively large diameter so as to enable growth of large diameter crystals ranging in diameter from 4 to 12 inches, preferably ranging from 6 to 9 inches, and a crystal ingot length ranging from 10 to 160 inches, preferably 40 to 120 inches. Outer chamber 12 has a diameter of about 18 inches to about 36 inches, preferably about 18 inches to about 28 inches. Inner growth chamber 14 has a diameter of about 10 inches to about 30 inches. Crucible 15 is supported by susceptor 30 and enclosed within furnace tank 16. After chambers 12 and 14 are loaded with charge material 22, furnace tank 16 is closed and backfilled with a continuous flow of inert gas, preferably dry argon gas. The flow of gas through the system is directed in part by purge cone 32.

Next, melting is initiated by powering at least one periphery heater 18 and at least one bottom heater 19. Heat shields 20 and 21 may be generally positioned within furnace tank 16 to control radiation and create the appropriate thermal gradients. As melting occurs, additional charge material 22 is fed into outer chamber 12 using feeding device 24 until the desired mass of melt material 42 is present in crucible 15. Feeding device 24 generally comprises hopper 26 and vibratory chute 28. As charge material 22 in outer chamber 12 melts, it flows into inner growth chamber 14 via a passageway (not shown). The passageway may comprise an aperture, a notch, or a pipe, all as known in the art. The area between the wall of outer chamber 12 and the wall of inner growth chamber 14 is referred to as melt zone 34. The area within the wall of inner growth chamber 14 is referred to as growth zone 36. A baffle, weir, partition wall, or other dividing structure may optionally be provided within melt zone 34.

After the desired amount of charge material 22 is substantially melted in zones 34 and 36, crystal ingot growth is initiated with seed crystal 38 mounted in seed chuck 40. Seed crystal 38 may be a sample of the desired crystal material or any other material that has the same crystalline structure and a higher melting temperature than melt material 42. To begin growth, seed crystal 38 is lowered into molten melt material 42 in growth zone 36 using seed cable 44 and pull head assembly 46. As the portion of melt material 42 in contact with seed crystal 38 cools and crystallizes, seed crystal 38 is raised. During crystal ingot growth, pull head assembly 46 and seed cable 44 rotate seed crystal 38 in one direction and susceptor 30 rotates crucible 15 in the opposite direction. The rate of raising and rotation for seed crystal 38 and the rotation of susceptor 30 can be manipulated to change the mixing phenomenon the counter rotation creates in melt material 42, the amount of dopant taken up into crystal 52, and the size and shape of crystal 52. A typical crystal ingot 52 comprises a neck 47, shoulder 48, body 50, and tail (not shown). These various parts of crystal ingot 52 are grown by altering the rates of rotation, heating and lift. During growth, additional charge material 22 may be added to melt zone 34 using feeding device 24.

After crystal ingot growth is terminated, crystal ingot 52 is separated from melt material 42 and lifted into pull chamber 54 where it is isolated from the environment in furnace tank 16 and allowed to cool. After cooling, crystal ingot 52 is harvested in a standard manner known to those skilled in the art. The growth process may then be repeated to form a second crystal ingot in a sequential series of ingots.

Doping Model and Control System

One embodiment of the invention is directed to the use of a doping model that factors in the evaporation of the dopant when determining the concentration of the melt at any given time. The doping model is used to calculate the amount of additional dopant needed to achieve uniform resistivity. This model can be employed utilizing a controller to calculate the amounts and direct the addition of the precise amount of dopant needed at any given time. The controller may be a CPU or other computerized controller adapted to monitor the melt level, crystal ingot weight, charge material weight, crystal ingot rotation rate, susceptor rotation rate, crystal ingot diameter, melt material temperature, and other variables relating to the CCZ process.

Figure 2:
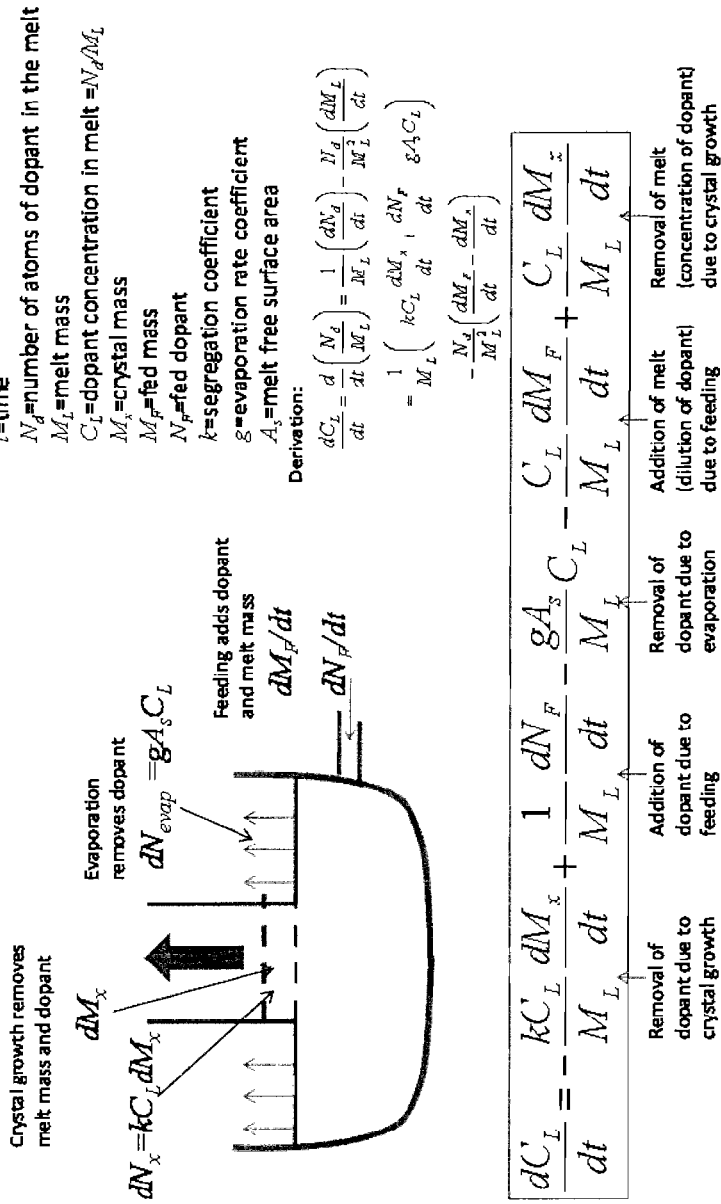
FIG. 2 is a summary diagram of the dopant model, including Formula I.

The controller is also programmed to monitor the run time of the system beginning with the initial charge and ending with conclusion of growth of the last crystal ingot within the run. Typically a run will last for about 25 to 400 hours with the growth of about 2 to 20 ingots. The controller is also programmed to control the amount of dopant and silicon charge material fed to the system during the initial charge, inter-ingot doping to inner growth chamber 14 and continuous or semi-continuous feeding and doping to outer chamber 12. The amount of dopant added is determined by the controller in accordance with Formula I, as identified below and shown in FIG. 2, which predicts the dopant concentration of the melt in inner growth chamber 14 at any given time, and then calculating the amount of additional dopant needed based on the desired resistivity for the ingot. Formula I:

$$\frac{dC_L}{dt} = -\frac{kC_L}{M_L}\frac{dM_x}{dt} + \frac{1}{M_L}\frac{dN_F}{dt} - \frac{gA_s}{M_L}C_L - \frac{C_L}{M_L}\frac{dM_F}{dt} + \frac{C_L}{M_L}\frac{dM_x}{dt}$$

Where t=time, $N_d$=number of atoms of dopant in the melt, $M_L$=melt mass, $C_L$=dopant concentration in melt=$N_d/M_L$, $M_x$=crystal mass, $M_F$=fed mass, $N_F$=fed dopant, k=segregation coefficient, g=evaporation rate coefficient and $A_s$=melt free surface area. The evaporation rate coefficient g will be a function of a number of factors, including the dopant type and concentration in the melt, the hot zone configuration (i.e. melt volume, melt temperature, seed and crucible rotations), the pressure and gas flow rates and path, the oxygen concentration in the melt, the dopant atoms in the feed entering the inner growth zone from the annular or melt zone ($N_F$), and the path through the melt zone to the inner growth zone. The melt free surface area ($A_s$) will be different during crystal growth (where there is less free surface area) and in the intervals between crystal growth (where there is greater free surface area). FIG. 2 depicts a model system and shows the derivation of Formula I. Most parameters of the model will have dependence on various environmental factors. These dependencies may be neglected for engineering purposes to the extent their impact on precision is small or may be incorporated into the model to further refine it. FIG. 3 shows an example of how Formula I is applied to batch Cz when evaporation is not a factor. In FIG. FIG. 4 shows an example of how Formula I is applied to CCZ when evaporation is not a factor. In FIG. 5 shows an example of how Formula I is applied to CCZ when evaporation is a factor.

Addition of Dopant to Inner Growth Chamber

In a second embodiment of the present invention, a predetermined amount of dopant is added to inner growth chamber 14 at intervals between growth of crystal ingot 52. After a first crystal ingot is harvested, dopant is added to inner growth chamber 14 to replace dopant lost from melt material 42 through evaporation and taken up in the prior crystal. To avoid contamination of melt material 42, the present inventors have developed a system for inter-ingot doping comprising the use of an open "sacrificial vessel" lowered into growth zone 36 via seed chuck 40.

Figure 6:
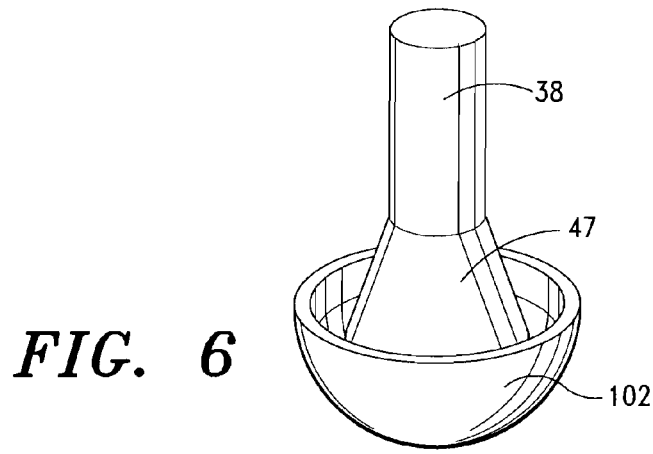
FIG. 6 is a perspective view of a vessel formed on the end of a seed crystal in accordance with one embodiment of the invention.

In a one embodiment shown in FIG. 6, a sacrificial vessel 102 is grown on seed crystal 38 (or the neck of the prior crystal). A preferred shape for the vessel is a cup. The cup shaped vessel 102 may be grown by using seed crystal 38 to grow neck 47. Then the seed lift is reversed slightly such that a small portion of neck 47 is positioned just below the surface level of the melt material. Surface tension creates cup shaped vessel 102 around the portion of neck 47 positioned just below the melt surface level, which permits upward growth around the perimeter of the meniscus. When the cup shaped vessel 102 is grown to a desired size, preferably having about a 6 cm diameter, the cup is rapidly withdrawn. It may then be filled with elemental dopant such as solid gallium pellet(s) and then submerged into growth zone 36 where it will melt and release the dopant.

Figure 7:
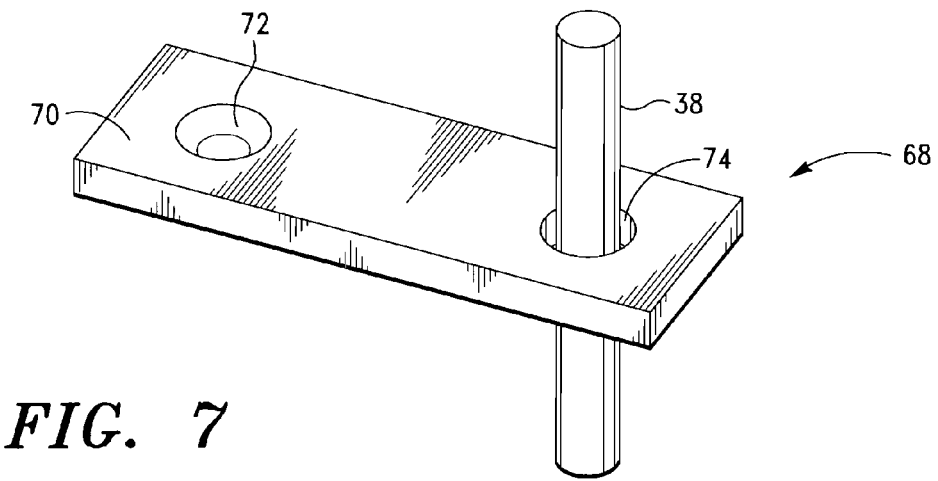
FIG. 7 is a perspective view of a seed crystal inserted into a dopant vessel in accordance with one embodiment of the present invention.
Figure 8:
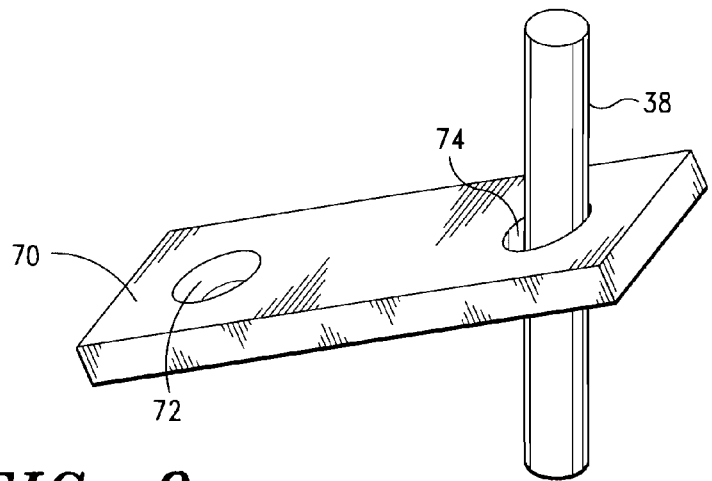
FIG. 8 is a perspective view of the dopant vessel of FIG. 7 mounted on the seed crystal via friction.

In another embodiment, a pre-formed sacrificial silicon vessel is mounted on seed crystal 38 (or the neck of the prior crystal) at intervals between growth of crystal ingot. To prevent contamination of the melt, the pre-formed vessel may be cleaned by acid etching using a mixture of hydrofluoric acid, nitric acid, and acetic acid as is well known in the art. In one embodiment shown in FIGS. 7 and 8, pre-formed vessel 68 is a machined rectangular silicon plate having an off-set aperture 74 through which the end of seed crystal 38 may be inserted for mounting the plate on the seed crystal. Top surface 70 of vessel 68 also has a pit or well 72 configured to hold an amount of dopant such as elemental gallium. Once the dopant is loaded into the well 72, the lower end of seed crystal 38 is inserted through aperture 74 and the vessel 68 is moved upward such that it is positioned around the crystal at a location remote from the lower end of seed crystal 38. As shown in FIG. 8, when support for vessel 68 is removed, vessel 68 tilts due to the off-set nature of aperture 74 and the weight of the vessel. Vessel 68 is thereby mounted to the seed crystal via friction without the need for other attachment means. Vessel 68, holding the dopant in well 72, is then lowered into growth zone 36 via lowering of seed crystal 38 where it will melt and release the dopant. Using a machined vessel such as vessel 68, as opposed to growing a sacrificial vessel, saves time in the crystal pulling process.

Figure 9:
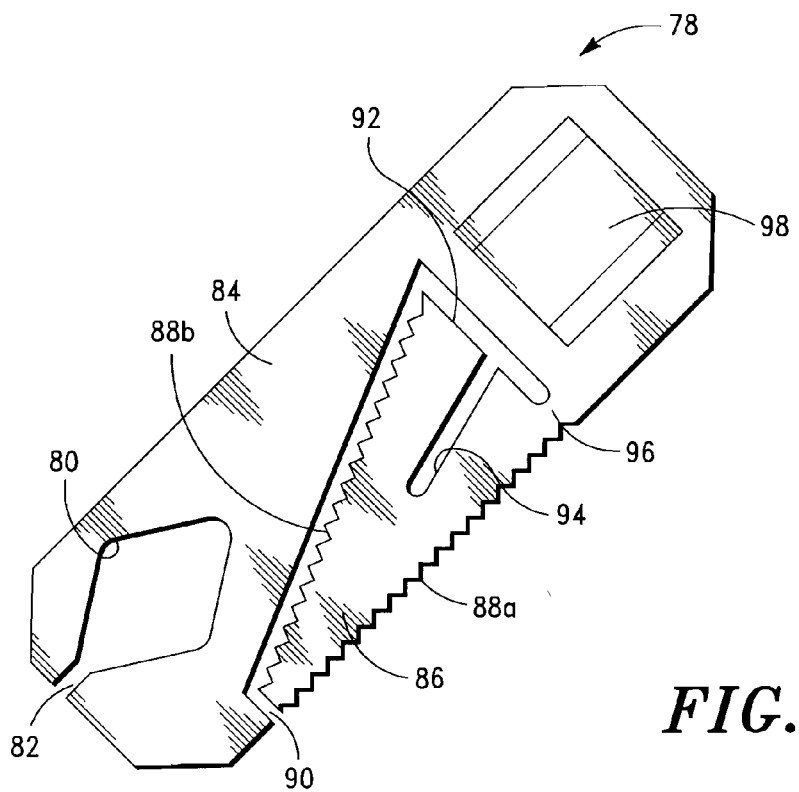
FIG. 9 is a perspective view of a dopant vessel in accordance with another embodiment of the present invention.
Figure 10:
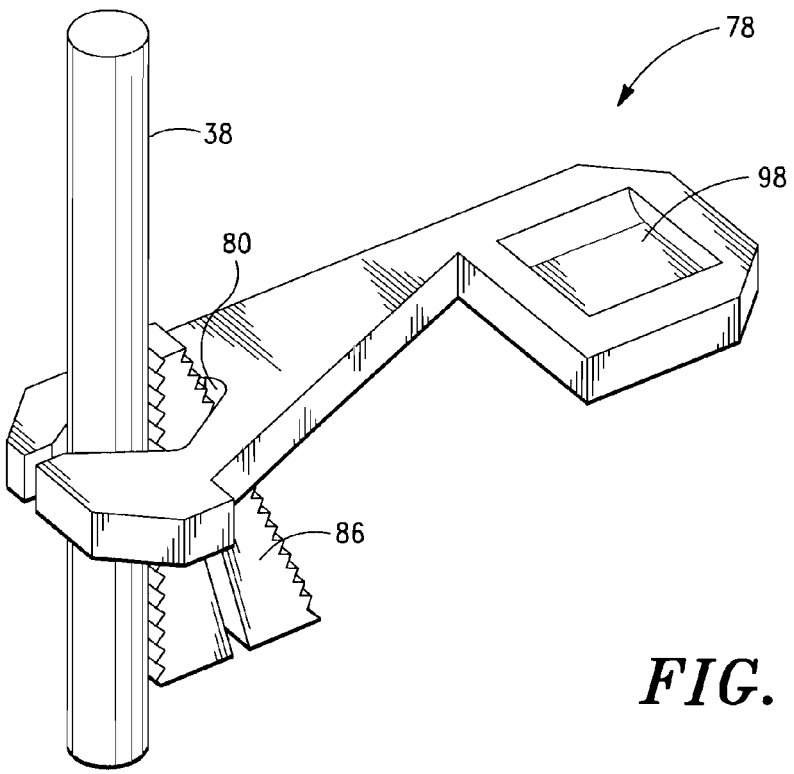
FIG. 10 is a perspective view of the dopant vessel of FIG. 9 mounted on the seed crystal via friction a wedge portion.

In an alternative embodiment, shown in FIGS. 9 and 10, pre-formed vessel 78 is a machined rectangular silicon plate having an off-set aperture 80 through which the end of seed crystal 38 may be inserted for mounting the plate on the seed crystal. Aperture 80 is generally diamond shaped and is positioned adjacent one edge of vessel 78. A slot 82 extends from the outer edge of vessel to aperture 80 to accommodate expansion of the aperture. Top surface 84 of vessel 78 also has a well 98 configured to hold an amount of dopant such as elemental gallium. An elongated triangular shaped wedge 86 formed in vessel 78 has inner and outer serrated edges 88a and 88b, a top edge 90 and a lower edge 92. A central slot 94 extending a distance from lower edge 92 toward top edge 90 of the wedge accommodates compression of the wedge. An opening is formed adjacent top edge 90, inner side edge 88b and a major portion of lower edge 92 so that these portions are not connected to the remainder of vessel 78. The only connection between wedge 86 and the remainder of vessel 78 is a break-off bridge 96 extending from a portion of lower edge 92 along outer side edge 88a. Before using vessel 78, wedge 86 will be broken off from the remainder of vessel 78 along break-off bridge 96. Dopant is loaded into well 72, the lower end of seed crystal 38 is inserted through aperture 80 and vessel 78 is moved upward such that it is positioned around the crystal at a location remote from the lower end of seed crystal 38. As shown in FIG. 10, wedge 86 is then inserted upward through aperture 80 adjacent seed crystal and pushed until it is securely positioned in abutting engagement with portions of the inner edge of aperture 80 and seed crystal 38. In this manner, vessel 78 is mounted to the seed crystal via friction without the need for other attachment means. The shape of wedge 86 accommodates various sizes of seed crystals within aperture 80 by permitting wedge 86 to be inserted further upward through aperture for smaller seed crystals to obtain a secure fit. Vessel 78, holding the dopant in well 98, is then lowered into growth zone 36 via lowering of seed crystal 38 where it will melt and release the dopant.

Because varying amounts of dopant may be selectively added to the vessel, the controller may control the precise amount of dopant to be added to growth zone 36 to achieve the desired concentration. For example, uniformly sized elemental gallium pellets having a fixed mass can be added to the vessel at the direction of the controller in the precise amount calculated in accordance with Formula I above to achieve the desired concentration for any given ingot. It should be understood, that while various configurations of the vessel have been described, other configurations of crystalline material grown from the melt material or pre-manufactured from crystalline material capable of receiving, retaining and delivering varying amounts of dopant to the melt in inner growth chamber 14 via lowering of the seed chuck 40 are within the scope of this invention.

Addition of Dopant to Outer Chamber

Figure 12:
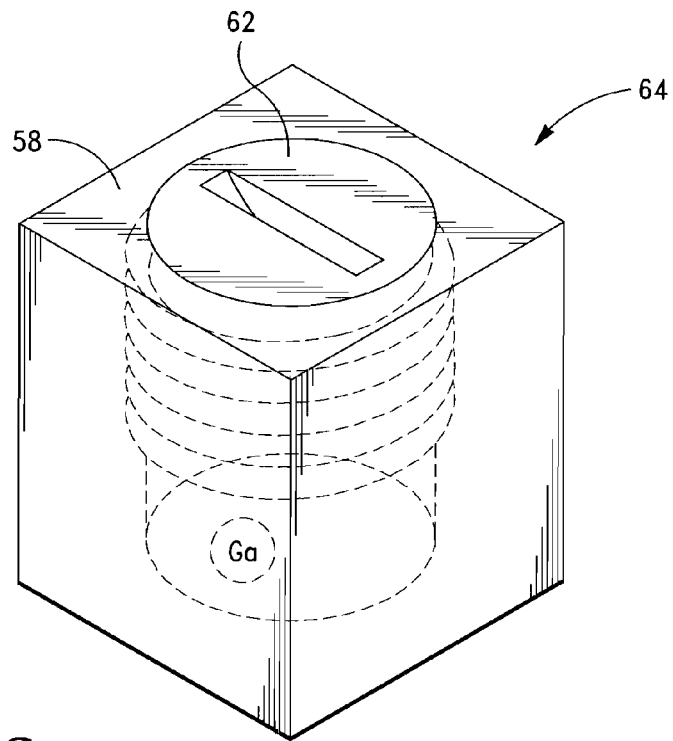
FIG. 12 is a perspective view of a sealed dopant container used in accordance with the present invention.

In another embodiment of the present invention, predetermined amounts of dopant are added to melt zone 34 at least once during growth of crystal ingot 52. Several methods of adding dopant during the CCZ process are known in the art. These methods include adding dopant in the form of thin rods, which are fed continuously into the melt, or feeding dopant pellets into the melt. Although these methods may be sufficient for adding dopants with relatively high melting points, they are not sufficient for a dopant with a relatively low melting point, like gallium (see FIG. 11). The present inventors have devised a novel system for adding dopants, like gallium, at least once during growth of crystal ingot 52 using dopant container 64 that fully encapsulates the dopant. As shown in FIG. 12, dopant container 64 comprises container body 58, threaded plug 62, and dopant.

Figure 13:
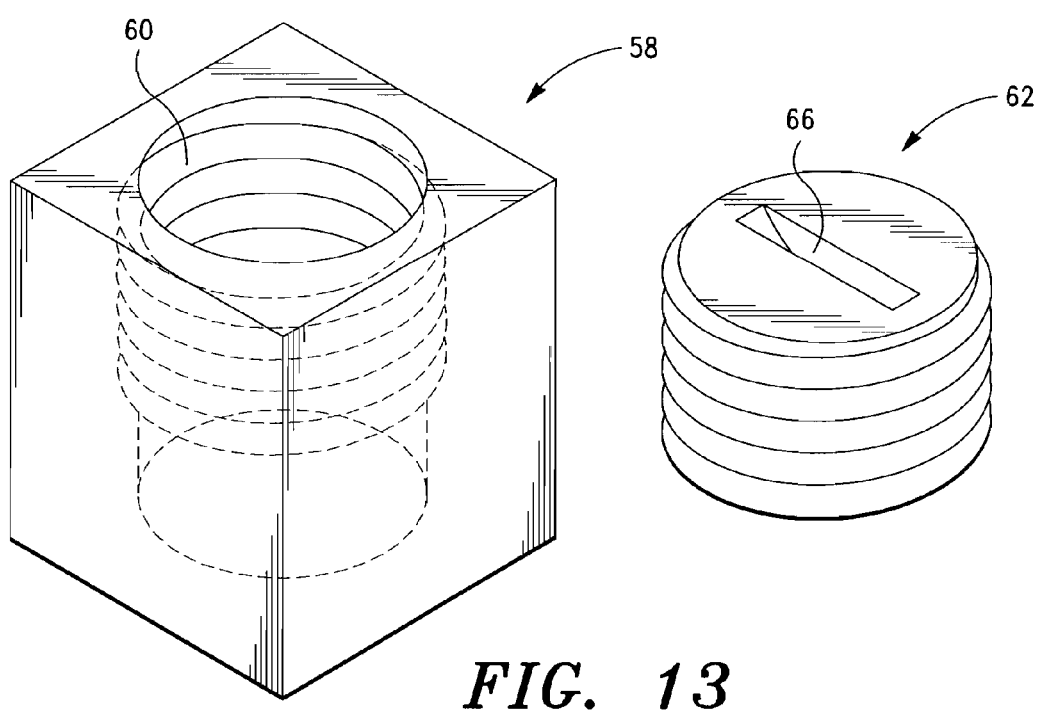
FIG. 13 is a perspective view of an unsealed dopant container used in accordance with the present invention.

With reference to FIG. 13, container body 58 is preferably a hollow cube constructed out of charge material 22, such as silicon. For purposes of doping with gallium, container body 58 preferably has a dimension ranging from about 4-24 mm$^2$, most preferably about 12 mm$^2$. Container body 58 includes threaded cavity 60. A predetermined amount of elemental dopant is added to cavity 60 in solid form (such as a pellet) or liquid form. In the case of gallium, for example, elemental gallium in the form of a pellet having a diameter ranging from 0.5-5 mm, preferably 1 mm, and weighing approximately 0.015-0.15 g, preferably 0.03 g may be used. After the dopant has been loaded, threaded plug 62 is screwed into cavity 60. Threaded plug 62 may be screwed in short of flush, flush (as shown in FIG. 12), or past flush with the top of container body 58. Slot 66 is provided in the top of threaded plug 62 such that a screwdriver or other tool may be used to screw threaded plug 62 into cavity 60 of container body 58 to the desired depth. Container body 58 and plug 62 are machined using diamond-tipped tools, then etched with a formulation of acids and other materials known in the art, and finally bagged, preferably in polyethylene or other non-contaminating bags. Of course, dopant containers 64 may be any shape that can enclose a desired amount of dopant. The process for making, cleaning, and storing dopant containers 64 must be carefully controlled so as to avoid contamination, including iron contamination. Although doping using dopant containers 64 is particularly advantageous for volatile dopants or dopants with low melting points, any desired dopant or additive may be added to melt material 42 in this way. Potential dopants include phosphorous, boron, gallium, aluminum, indium, antimony, germanium, arsenic or silicon alloys thereof. Dopant containers 64 may also be used to dope between ingots (as described below) or in batch CZ as well.

Figure 14:
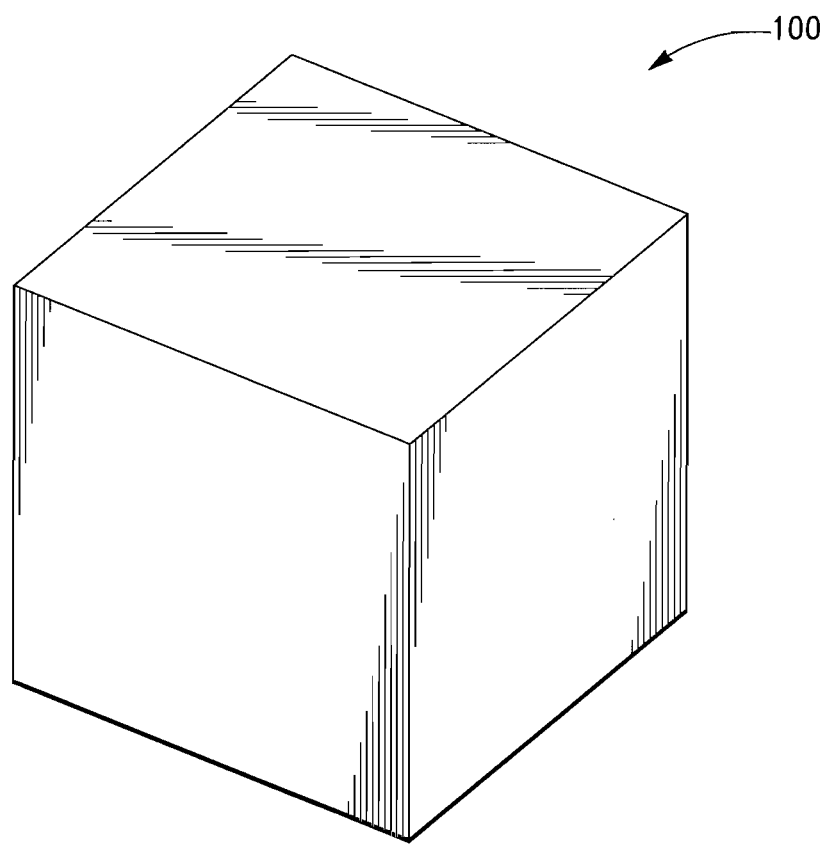
FIG. 14 is a perspective view of an alloy cube in accordance with one embodiment of the present invention.

Alternatively, solid dopant alloy cubes 100 as shown in FIG. 14, may also be used to replenish the dopant in melt material 42. Dopant alloy cubes can be made using the CCZ process (or any other silicon crystal growth process) to grow a silicon ingot that has a desired concentration of dopant (dopant containers 64, described above, may be used to deliver dopant into the CCZ process used to grow the desired doped ingot) and then machining the ingot into the desired size cubes so as to have a precise amount or concentration of dopant. Of course other shapes may be used, such as a pyramid or sphere shape, and preferably each type of dopant alloy would have its own shape so as to avoid doping with the wrong dopant. When the dopant alloy is cube-shaped, the dimensions are preferably 8 mm$^3$.

The dopant concentration in each dopant alloy cube is obtained by measuring the resistivity and using well-known relationships between geometry and concentration. The device used to measure resistivity is typically a four-point probe which measures resistivity through current and voltage characteristics of the material. This technique is well known to one of ordinary skill in the art and incorporates the international standards and procedures of organizations such as SEMI. The use of dopant alloy cubes is limited by the liquid solubility of the dopant in silicon (solid solubility values, which are useful for a relative comparison of solubility among the listed dopants, are provided for the dopants in FIG. 11). For example, when a dopant, such as gallium has a relatively low solubility in silicon, the required concentration of gallium in the liquid to make an 8 mm$^3$ dopant alloy cube is very large.

Dopant alloy cubes 100 or dopant containers 64 may be added to outer chamber 12 during crystal ingot growth using a doper mechanism configured to deliver a very well controlled amount of dopant. For example, dopant alloy cubes of phosphorous or boron may contain about 1e-4 g and up to about 1e-5 g of dopant per alloy cube. Dopant containers 64 may be designed to each contain similar amounts of boron or phosphorous or about 0.001 g to about 0.03 g of gallium depending on the resistivity level desired in the finished ingot. Because dopant containers 64 are formed of silicon, the dopant contained within the containers will likely melt during the feeding process, but the containers will not melt until they are incorporated into the melt. Thus, dopants having low melting points can be conveniently fed into melt zone 34 or growth zone 36 in precise quantities and without damaging the apparatus. The amount of dopant included within the containers may be a fixed amount or there may be a series of different containers with different fixed amounts of dopant available for selection by the controller depending upon the amount of dopant required in accordance with the doping model. For instance, where a larger concentration of dopant is required, dopant containers 64 are preferred since they hold elemental dopant. Where lower amounts of dopant are required, the silicon/dopant alloy cubes may be utilized in accordance with the doping model.

In one embodiment, the doper is located inside furnace tank 16 and is in flow communication with feeding device 24. The doper comprises a loadable magazine and a dispensing actuator. One or more dopant containers 64 or dopant alloy cubes are loaded into the magazine. At one or more predetermined times during crystal growth, the dispensing actuator dispenses a dopant container or dopant alloy cube from the magazine into feeding device 24, which deposits it in outer chamber 12. In outer chamber 12, dopant container 64 or dopant alloy cube melts and releases the dopant contained therein. A series of valves and isolation chambers may also be provided to allow reloading of the magazine during a run without losing pressure in or contaminating furnace tank 16. Alternatively, the magazine may be positioned outside furnace tank 16. In this embodiment, dopant containers 64 or dopant alloy cubes cross a pressure boundary just prior to being dispensed into a component of feeding device 24 within furnace tank 16.

EXAMPLE 1

Figure 15:
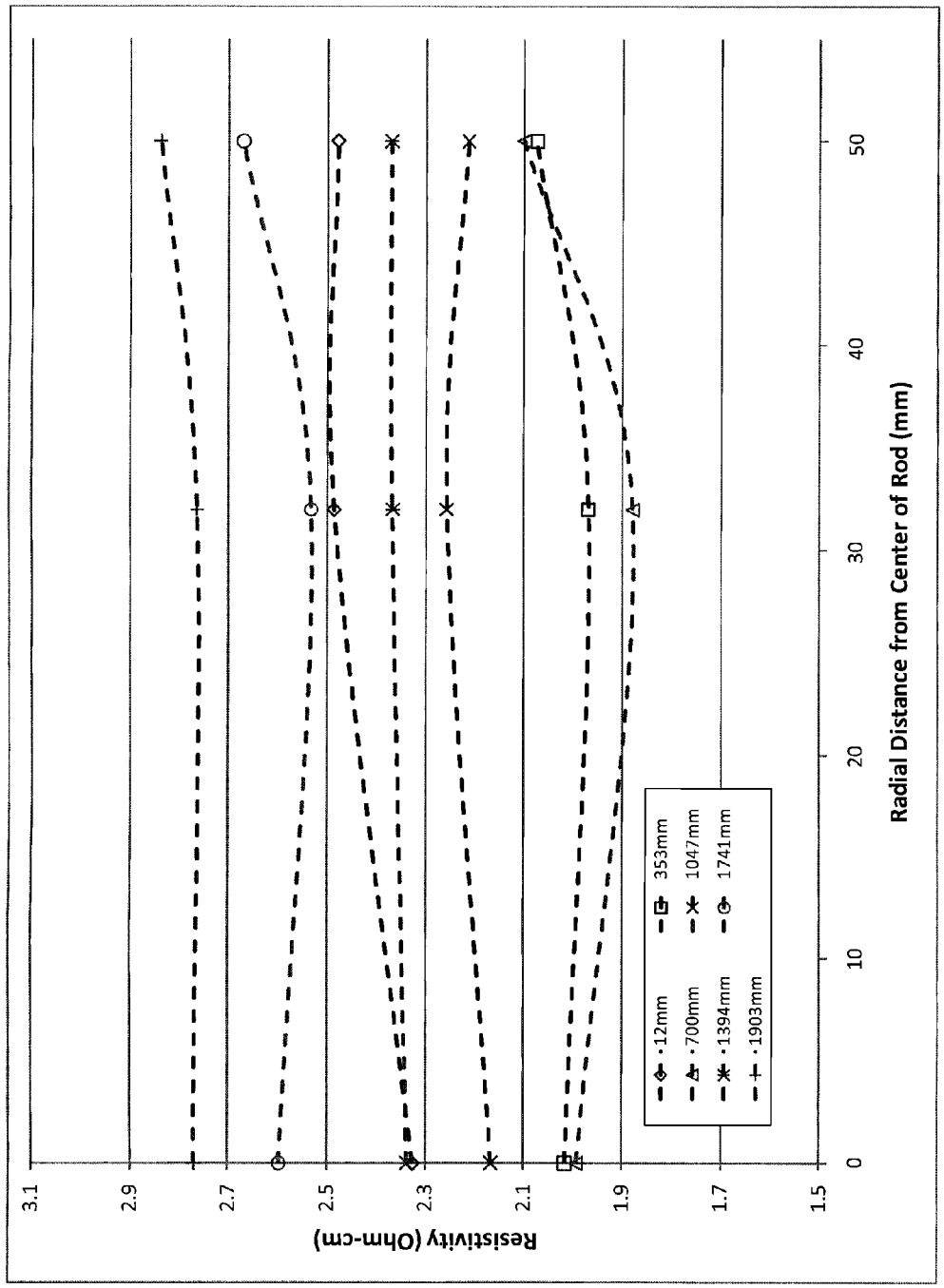
FIG. 15 is a graph of radial resistivity of a single crystal ingot made in accordance with the present invention.
Figure 16:
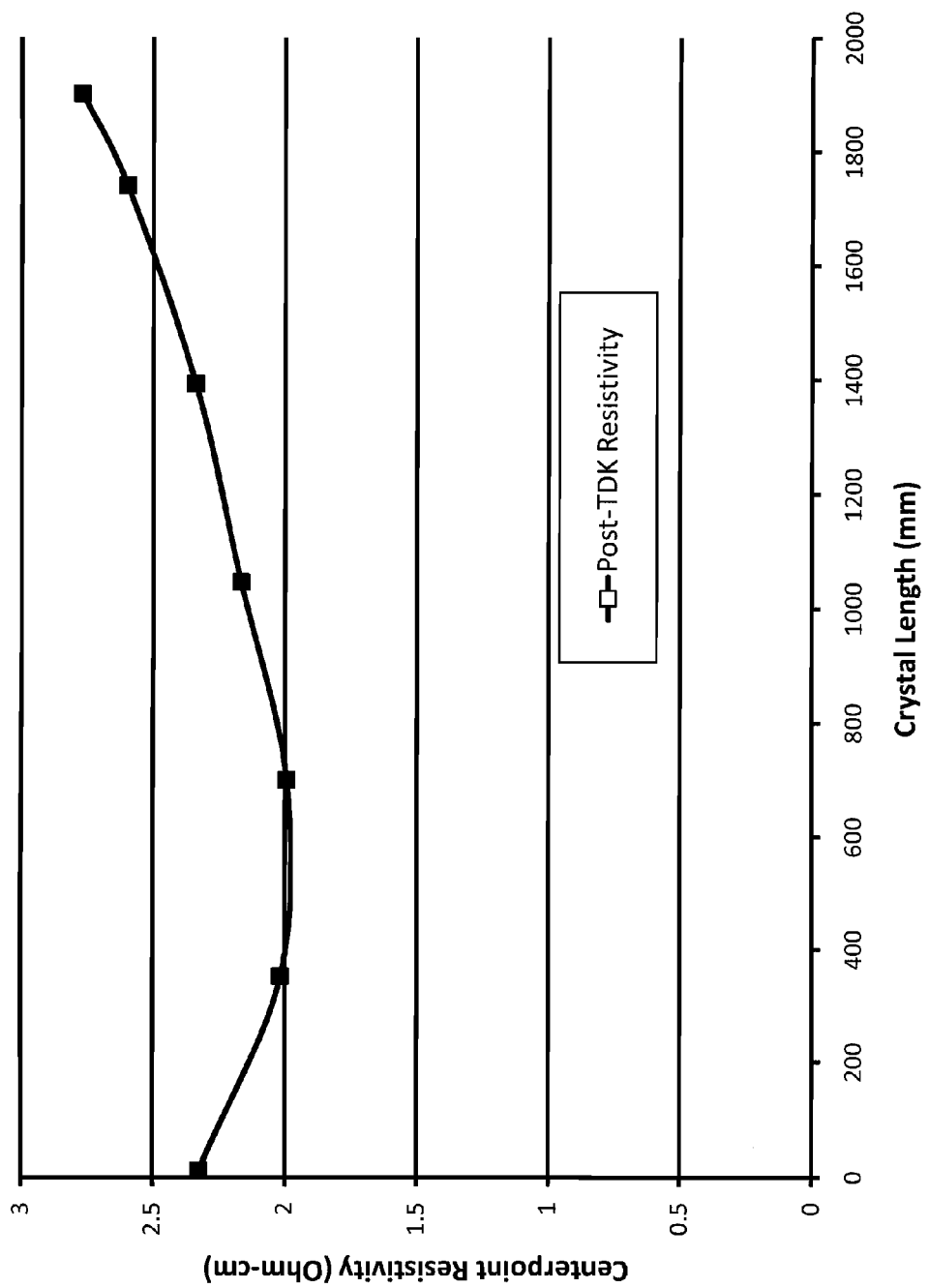
FIG. 16 is a graph of longitudinal resistivity of a single crystal ingot made in accordance with the present invention.

In FIG. 15, the radial resistivity of a crystal ingot (sample 1) made in accordance with the preferred embodiment of this invention is shown. The crystal was the third ingot grown in a CCZ run wherein elemental gallium was added in the initial charge and within the growth zone 36 via a cup-like vessel formed on seed crystal 38 between ingots in an amount determined in accordance with the doping model. No additional dopant was added into the melt zone 34 during crystal growth or between ingot growth. As can be seen, the radial resistivity is relatively uniform throughout the length of the crystal. It is noted that the resistivity measurements for all examples were taken post thermal donor kill or TDK, a heat treatment that is applied to silicon wafers so that their measured resistivity better reflects actual working resistivities for use in solar cells. FIG. 16 shows the resistivity of the crystal sample 1 along the axial length of sample 1.

EXAMPLE 2

Figure 17:
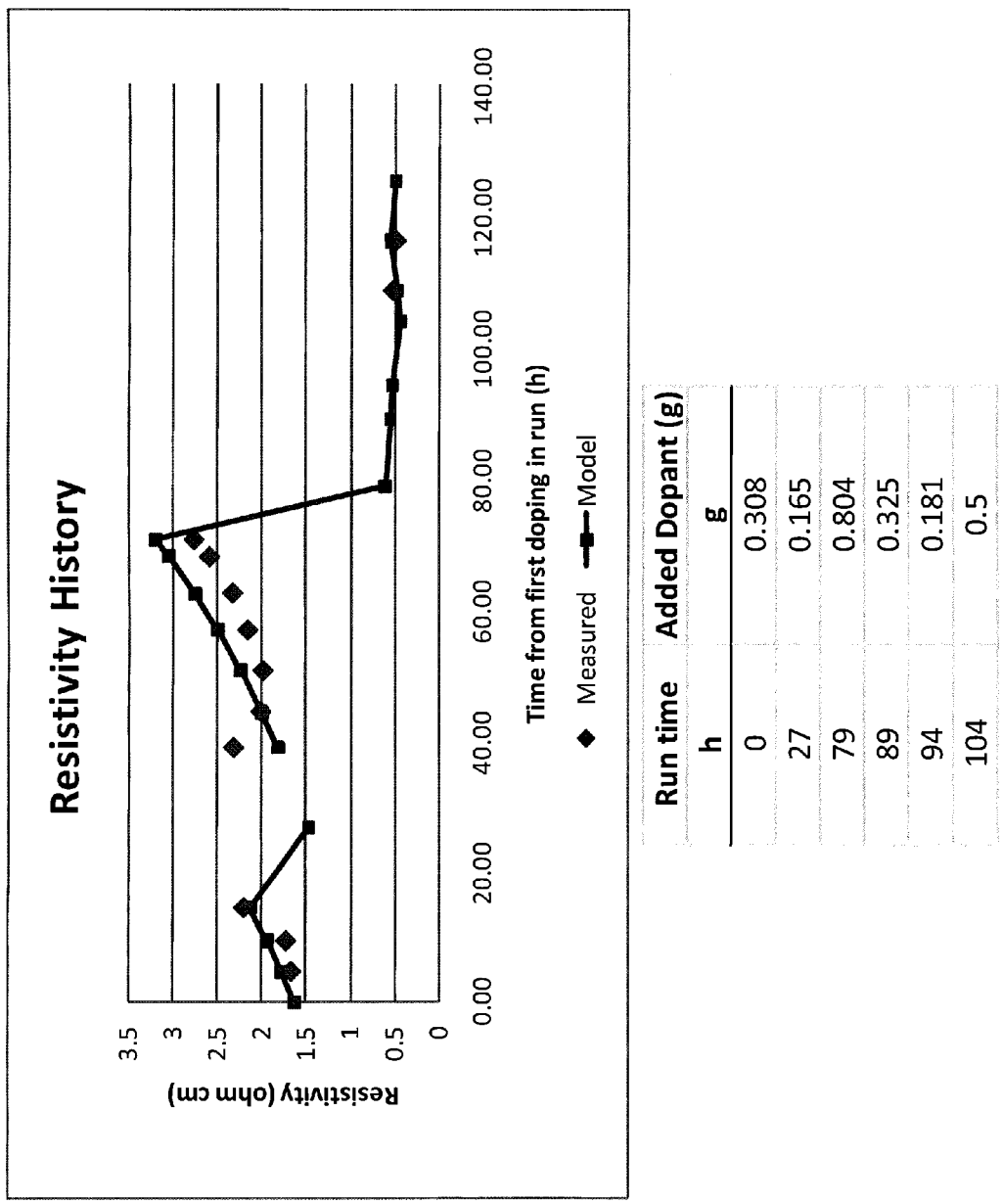
FIG. 17 is a chart of dopant additions relating to three single crystal ingots made in accordance with the present invention.

FIG. 17 shows the actual amount of gallium dopant added to three crystal ingots produced using the CCZ process and in accordance with the doping model of the present invention. The amount of dopant added inter-ingot was determined in accordance with the doping model and based upon the desired resistivity of the ingot. No additional dopant was added in the outer chamber during or between ingot growth. FIG. 17 shows the anticipated resistivity in accordance with the model and the actual measured resistivity.

Figure 18:
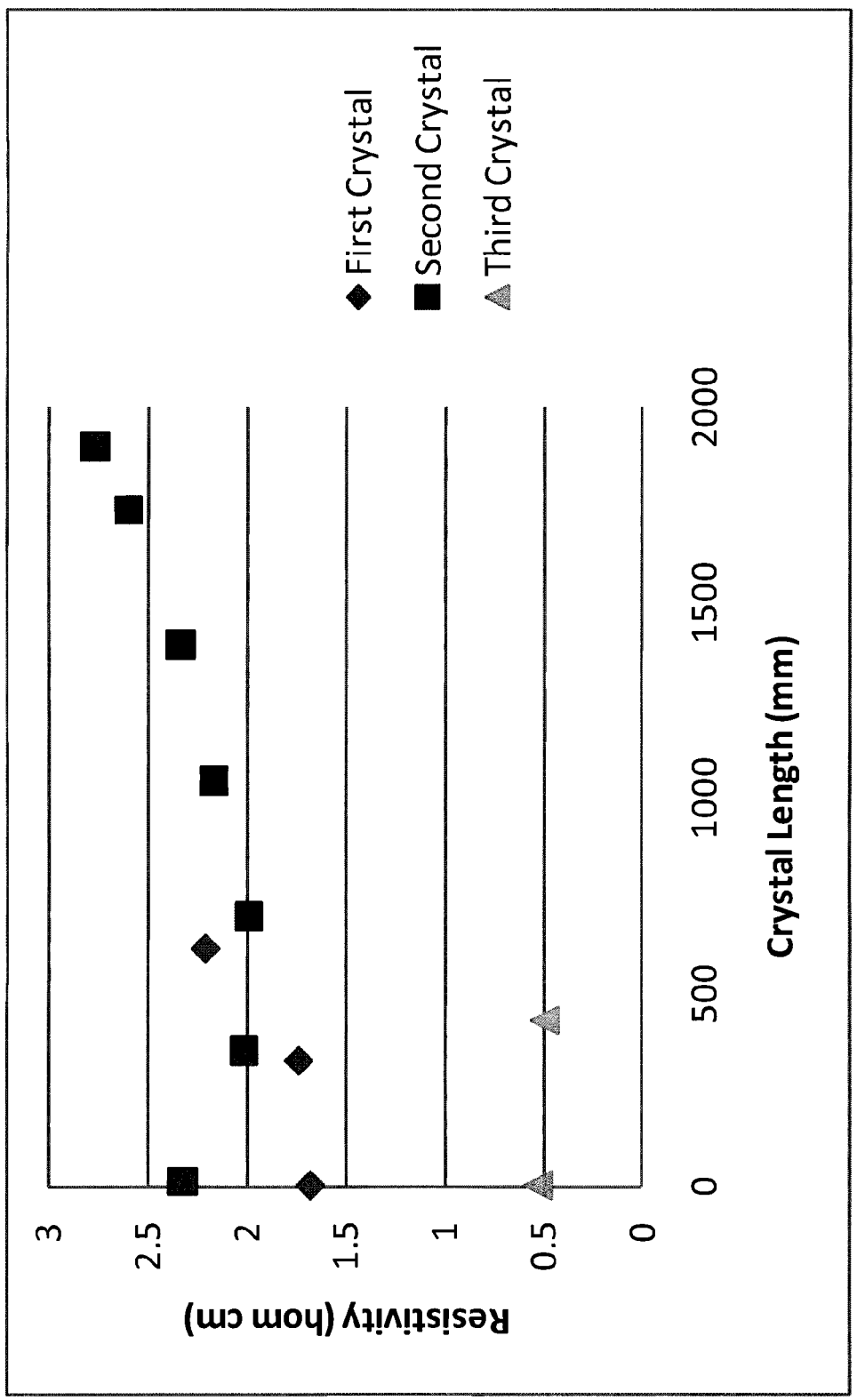
FIG. 18 is a graph of longitudinal resistivity of three single crystals made in accordance with the present invention.
Figure 19:
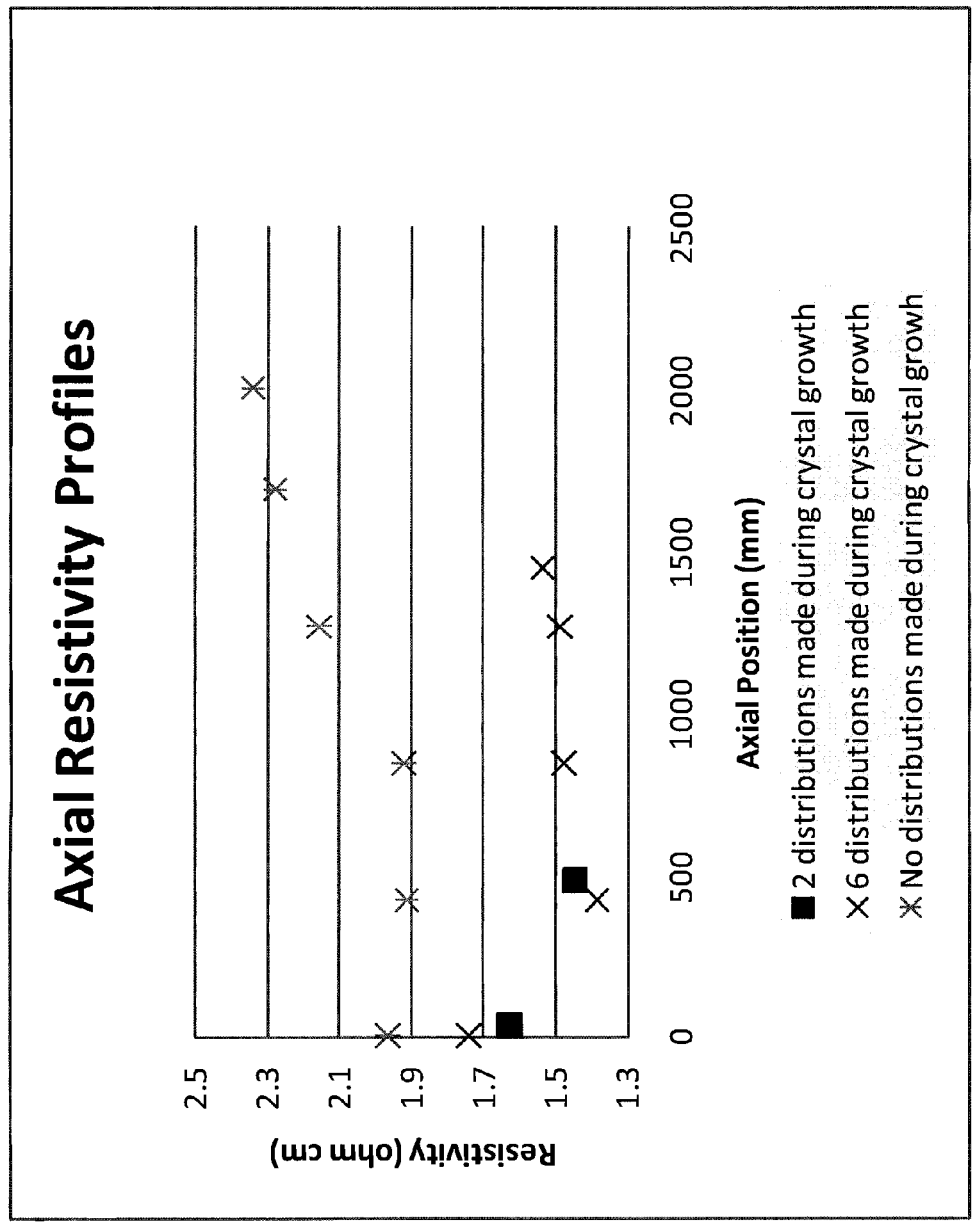
FIG. 19 is a graph of longitudinal resistivity of three single crystals made in accordance with the present inventions.

FIG. 18 shows the actual resistivity of the three crystals grown and shown in preceding FIG. 17 along the length of each crystal. FIG. 19 shows the axial resistivity of crystals grown with both gallium doping in the inner growth chamber between ingot growth and additional dopant added during growth to the outer chamber by means of dopant containers, in comparison to a crystal with doping only to the inner growth chamber between ingot growth. It is noted that the resistivity is further flattened when additional dopant is added during growth.

EXAMPLE 3

For this experiment, 40 solar cells were made from 125 mm×125 mm pseudo-square wafers. Next to a control group of 10 wafers for the optimization, 15 cells were made of boron doped substrates using a CCZ process with addition of dopant to the inner growth chamber between ingot growth and addition to the outer growth chamber during growth, and 15 cells were made of gallium doped substrates with addition of dopant to the inner growth chamber between ingot growth. The resistivities of the wafers are given in Table I. Note that Group 2 has approximately double the dopant concentration compared to Group 1.

TABLE I

Resistivities of the used substrates.

|  | Base doping | Resistivity |
| --- | --- | --- |
| Group 1 | p-type, Boron | 2.1 Ω cm |
| Group 2 | p-type, Gallium | 1.0 Ω cm |

Figure 20:
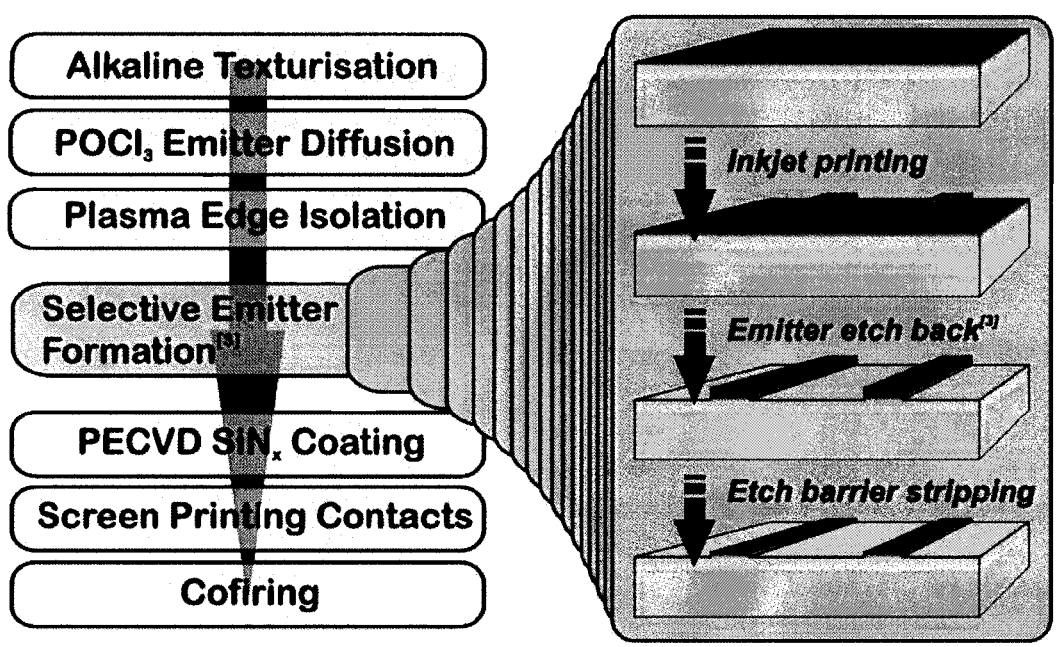
FIG. 20 is a flow diagram of the selective emitter approach used in Example 3.

With reference to FIG. 20, the solar cell process used in this experiment was a selective emitter approach adhering closely to standards used in the industry. The cells underwent an alkaline texturing before POCl3 emitter diffusion to about 30 Ω/sq and plasma edge isolation. Subsequently, an etch resist grid was applied by inkjet printing, followed by selective emitter formation via acidic etch-back to around 70 Ω/sq. Afterwards, a SiNx anti-reflection coating was deposited by plasma-enhanced chemical vapor deposition (PECVD) and the cells were metalized by screen printing Ag-paste on the front and Al-paste on the rear side before being cofired in a belt furnace.

Usually, the emitter is a major contributor to overall recombination due to its heavily doped "dead layer." Application of a selective emitter helped to make the solar cells more sensitive to slight changes in the bulk lifetime since the recombination in the emitter region is suppressed. Immediately after firing, the solar cells were I-V measured to determine their undegraded initial state. The results are displayed in Table II.

TABLE II

Solar Cell Results

|  | FF | $J_{SC}$ [mA/cm$^2$] | $V_{OC}$ [mV] | Efficiency |
| --- | --- | --- | --- | --- |
| B, avg. | 78.7% | 35.9 | 633 | 17.9% |
| B, best | 79.0% | 36.1 | 634 | 18.1% |
| Ga, avg. | 79.2% | 35.7 | 634 | 17.9% |
| Ga, best | 79.6% | 35.9 | 637 | 18.2% |

Both groups are nearly identical in terms of efficiency. The gallium doped group shows a slight advantage in fill factor and VOC while the boron doped cells have a higher JSC. This could be an effect of the different net doping (see Table I).

Continuous Irradiation

Figure 21:
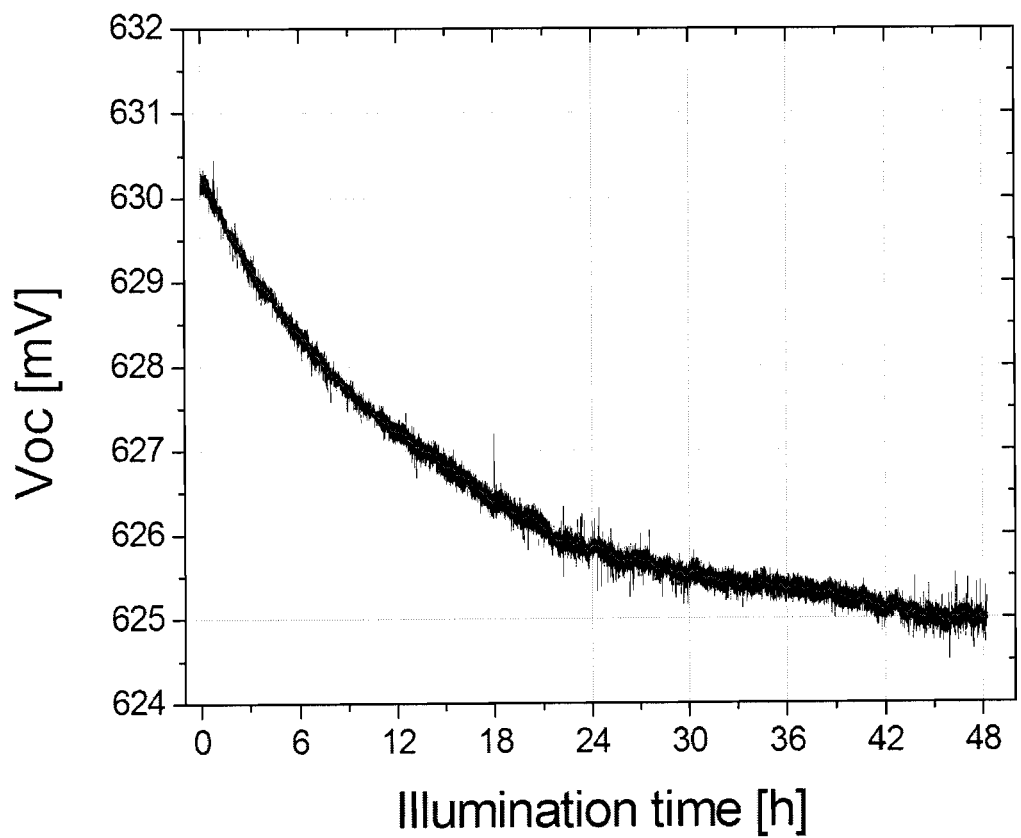
FIG. 21 is a graph of normalized open circuit voltage of one boron doped solar cell over a 48 hour irradiation period.
Figure 22:
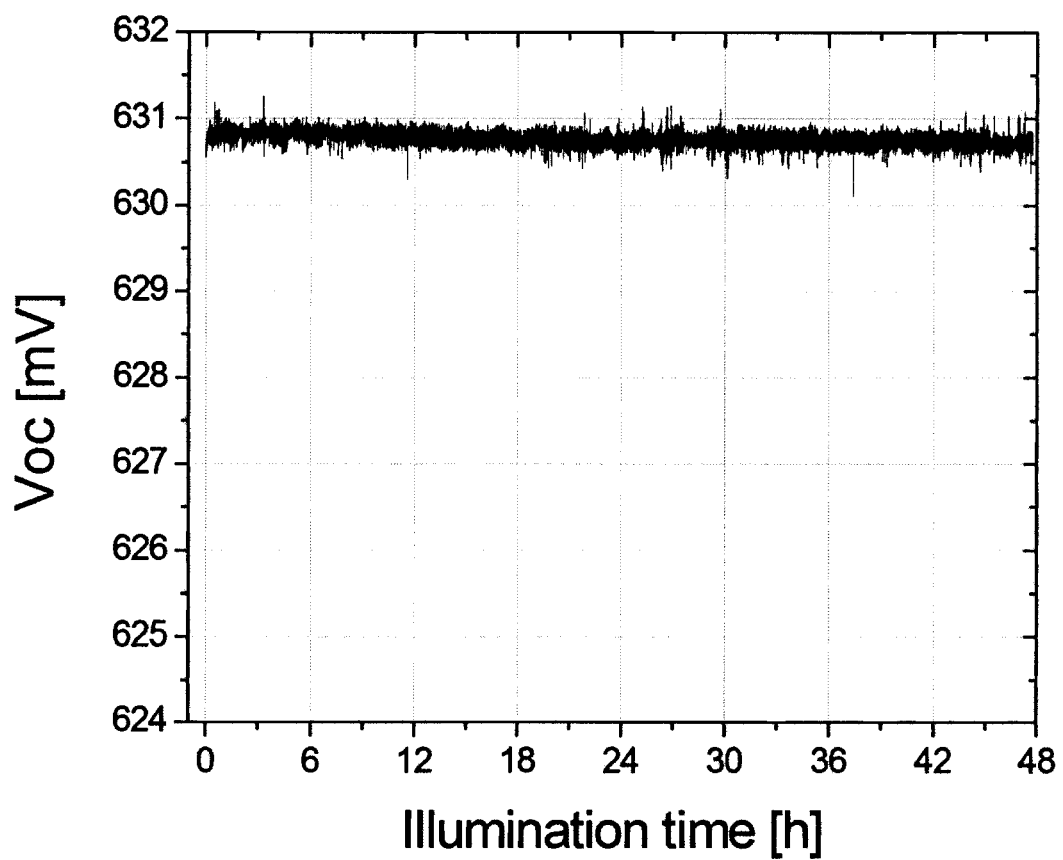
FIG. 22 is a graph of normalized open circuit voltage of one gallium doped solar cell over a 48 hour irradiation period.

After the initial IV measurements, the cells were subjected to continuous irradiation under 1 sun at 25° C. while their VOC was recorded along with cell temperature and illumination intensity for normalization purposes. Two exemplary graphs of these measurements are shown in FIGS. 21 and 22 for the boron doped cells and for the gallium doped cells respectively. The well-known kinetics of light-induced degradation can be observed: as shown in FIG. 21, the cells lose around 5-6 mV due to the formation of recombination-active boron-oxygen pairs in an exponential decay over about 48 hours to a new plateau level. Its time constants are in accordance to those published for the boron-oxygen complex and saturation at the new VOC level is generally reached between 48 and 72 hours.

As shown in FIG. 22, quite a different picture can be seen with the gallium doped cells. Their VOC development under illumination is displayed above and no degradation within the measurement errors can be detected. It is noteworthy that no gallium doped cell showed more than 0.5 mV VOC difference after 72 hours of continuous illumination.

After this procedure, the degraded cells were measured once again. A comparison of the cell parameter developments is given in Tables III and IV for the aforementioned exemplary solar cells.

TABLE III

Boron cell before and after 48 hours of continuous irradiation at 25° C.:

|  | Before | Diff. | After |
|---|---|---|---|
| FF | 77.9% | −0.8 | 77.1% |
| $J_{SC}$ [mA/cm$^2$] | 36.1 | −0.1 | 36.0 |
| $V_{OC}$ [mV] | 637 | −6 | 631 |
| Efficiency | 17.9% | −0.3 | 17.6% |

TABLE IV

Gallium cell before and after 48 hours of continuous irradiation at 25° C.:

|  | Before | Diff. | After |
|---|---|---|---|
| FF | 79.6% | 0.0 | 79.6% |
| $J_{SC}$ [mA/cm$^2$] | 35.9 | 0.0 | 35.9 |
| $V_{OC}$ [mV] | 637 | 0 | 637 |
| Efficiency | 18.2% | 0.0 | 18.2% |

Here, the boron doped cells show a deterioration in all solar cell parameters, leading to a decrease of 0.3% absolute in cell performance while the gallium doped cells' parameters remain largely unchanged within measurement error by the procedure.

Figure 23:
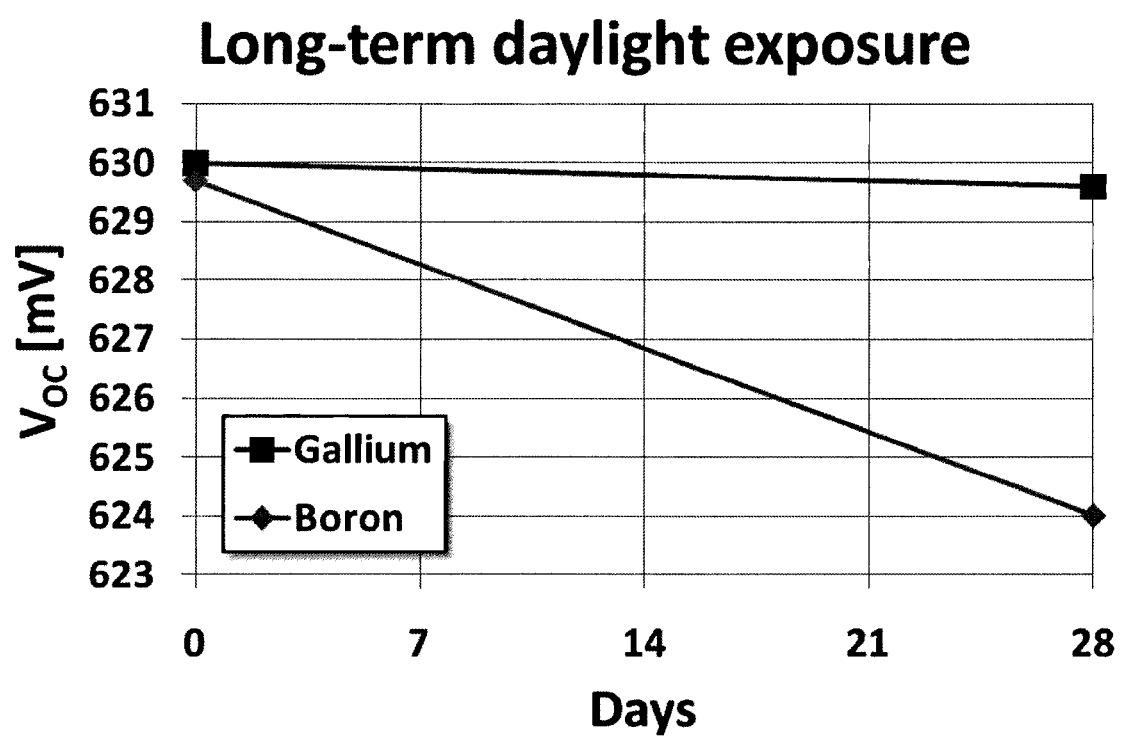
FIG. 23 is a graph of the average VOC of boron and gallium cells over a 4 week daylight exposure period.

Some of the cells were exposed to daylight for 4 weeks. They were held under open circuit conditions. While the degradation experiments involving days of constant 1 sun illumination do not resemble realistic operation conditions, they match the voltage drop results found in these practical tests. The results of the 4 week test are shown in FIG. 23. The boron doped cells show the same drop in VOC as seen in the continuous irradiation experiment after the saturation time, around 6 mV. The gallium doped samples' performance loss was on average 0.4 mV.

From the foregoing it will be seen that this invention is one well adapted to attain all ends and objectives herein-above set forth, together with the other advantages which are obvious and which are inherent to the invention. Since many possible embodiments may be made of the invention without departing from the scope thereof, it is to be understood that all matters herein set forth or shown in the accompanying drawings are to be interpreted as illustrative, and not in a limiting sense.

While specific embodiments have been shown and discussed, various modifications may of course be made, and the invention is not limited to the specific forms or arrangement of parts and steps described herein, except insofar as such limitations are included in the following claims. Further, it will be understood that certain features and sub combinations are of utility and may be employed without reference to other features and sub combinations. This is contemplated by and is within the scope of the claims.

The invention claimed is:

1. A method of preparing at least one doped silicon single crystal comprising the steps of:
   a) providing a melt material comprising silicon into a continuous Czochralski crystal growth apparatus;
   b) delivering a dopant to said melt material, wherein the dopant is gallium, indium, or aluminum;
   c) providing a seed crystal into said melt material, wherein said melt material is in molten form; and
   d) growing a doped silicon single crystal by withdrawing said seed crystal from said melt material, wherein additional melt material is provided to the crystal growth apparatus during the growing step,
   wherein a model is employed to predict dopant concentration within the melt material in an inner growth chamber of the crystal growth apparatus, wherein said model predicts an amount of evaporation of said dopant from the melt material over time.

2. The method of claim 1, wherein the method comprises sequentially preparing a series of doped silicon single crystals and wherein said delivering step comprises delivering said dopant into the melt material via one or more doping events.

3. The method of claim 2, wherein the frequency of said doping events is determined in part by calculating the amount of said dopant that has evaporated during the growing step.

4. The method of claim 3, wherein said one or more doping events comprises adding said dopant to an inner growth chamber of the crystal growth apparatus at intervals between successive crystal growth.

5. The method of claim 3, wherein said one or more doping events comprises adding said dopant to an outer melt chamber of a crystal growth apparatus during the growing step.

6. The method of claim 1, wherein said doped silicon single crystal has a resistivity variation along a longitudinal axis of less than 5%.

7. The method of claim 6, wherein said doped silicon single crystal has an interstitial oxygen level of less than 25 parts per million atoms.

8. The method of claim 1, wherein said doped silicon single crystal has a resistivity variation along a longitudinal axis of less than 2%.

9. The method of claim 8, wherein said doped silicon single crystal has an interstitial oxygen level of less than 25 parts per million atoms.

10. The method of claim 1, wherein said doped silicon single crystal has a resistivity variation along a radial axis of less than 5%.

11. The method of claim 10, wherein said doped silicon single crystal has an interstitial oxygen level of less than 25 parts per million atoms.

12. The method of claim 1, wherein said doped silicon single crystal has a resistivity variation along a radial axis of less than 2%.

13. The method of claim 12, wherein said doped silicon single crystal has an interstitial oxygen level of less than 25 parts per million atoms.

14. The method of claim 1, wherein said dopant is a dopant/silicon alloy.

15. The method of claim 2, wherein said one or more doping events comprises providing a silicon vessel, adding said dopant to said silicon vessel, and delivering said silicon vessel filled with said dopant to said melt material in an inner growth chamber of the crystal growth apparatus.

16. The method of claim 15, wherein providing a silicon vessel comprises growing a silicon vessel on said seed crystal using melt material in said inner growth chamber.

17. The method of claim 16, wherein providing a silicon vessel comprises pre-manufacturing a silicon vessel and mounting said vessel to said seed crystal.

18. The method of claim 17, wherein said silicon vessel is a plate having a well into which said dopant is added.

19. The method of claim 18, wherein said silicon vessel is mounted to said seed crystal via a friction fit.

20. The method of claim 2, wherein said one or more doping events comprises providing a silicon cube to an outer melt chamber of a crystal growth apparatus during the growing step, wherein said cube defines a center, threaded cavity with an amount of dopant contained therein and further comprises a threaded plug configured to be secured in a portion of said threaded cavity.

21. The method of claim 2, wherein said one or more doping events comprises providing a dopant alloy cube to an outer melt chamber of a crystal growth apparatus during the growing step.

22. The method of claim 2, wherein said doping events occur prior to growing each doped silicon single crystal in said series.

23. The method of claim 2, wherein said doping events occur during growth of each doped silicon single crystal in said series.

* * * * *